United States Patent
Fujii et al.

(10) Patent No.: US 8,450,182 B2
(45) Date of Patent: May 28, 2013

(54) METHOD OF MANUFACTURING NON-VOLATILE SEMICONDUCTOR MEMORY ELEMENT AND METHOD OF MANUFACTURING NON-VOLATILE SEMICONDUCTOR MEMORY DEVICE

(75) Inventors: Satoru Fujii, Osaka (JP); Takumi Mikawa, Shiga (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/574,254

(22) PCT Filed: Dec. 28, 2010

(86) PCT No.: PCT/JP2010/007595
§ 371 (c)(1), (2), (4) Date: Jul. 20, 2012

(87) PCT Pub. No.: WO2011/089682
PCT Pub. Date: Jul. 28, 2011

(65) Prior Publication Data
US 2012/0295413 A1 Nov. 22, 2012

(30) Foreign Application Priority Data
Jan. 25, 2010 (JP) ................................. 2010-012709

(51) Int. Cl.
*H01L 27/24* (2006.01)
(52) U.S. Cl.
USPC ............................. 438/382; 438/85; 438/438
(58) Field of Classification Search
USPC ....................................................... 438/382
See application file for complete search history.

(56) References Cited

U.S. PATENT DOCUMENTS

| 8,022,502 B2 * | 9/2011 | Kanzawa et al. ............. 257/529 |
| 2009/0052225 A1 | 2/2009 | Morimoto |
| 2009/0224224 A1 | 9/2009 | Fujii et al. |

(Continued)

FOREIGN PATENT DOCUMENTS

| JP | 05-291177 | 11/1993 |
| JP | 06-204404 | 7/1994 |

(Continued)

OTHER PUBLICATIONS

International Search Report issued Mar. 8, 2011 in International (PCT) Application No. PCT/JP2010/007595.

(Continued)

*Primary Examiner* — Telly Green
*Assistant Examiner* — Damian A Hillman
(74) *Attorney, Agent, or Firm* — Wenderoth, Lind & Ponack, L.L.P.

(57) ABSTRACT

A method of manufacturing a non-volatile semiconductor memory element including a variable resistance element and a non-ohmic element. The variable resistance element includes a first electrode, a variable resistance layer, and a shared electrode. The non-ohmic element includes the shared electrode, a semiconductor or insulator layer, and a second electrode. The method includes: forming the first electrode on a substrate; forming the variable resistance layer on the first electrode; forming the shared electrode by nitriding a front surface of the variable resistance layer; forming the semiconductor or insulator layer on the shared electrode; and forming the second electrode. In the forming of the shared electrode, a front surface of a transition metal oxide is nitrided by a plasma nitriding process to form the shared electrode comprising a transition metal nitride.

18 Claims, 17 Drawing Sheets

U.S. PATENT DOCUMENTS

| | | |
|---|---|---|
| 2009/0283736 A1 | 11/2009 | Kanzawa et al. |
| 2010/0032641 A1 | 2/2010 | Mikawa et al. |
| 2010/0237313 A1 | 9/2010 | Mikawa et al. |
| 2011/0294259 A1 | 12/2011 | Kanzawa et al. |

FOREIGN PATENT DOCUMENTS

| | | |
|---|---|---|
| JP | 2006-203098 | 8/2006 |
| WO | 2008/059701 | 5/2008 |
| WO | 2008/062688 | 5/2008 |
| WO | 2008/149484 | 12/2008 |
| WO | 2009/050861 | 4/2009 |
| WO | 2009/057262 | 5/2009 |
| WO | 2009/157479 | 12/2009 |

OTHER PUBLICATIONS

Wen-Fa Wu et al., "Effects of Nitrogen Plasma Treatment on Tantalum Diffusion Barriers in Copper Metallization", Journal of the Electrochemical Society, vol. 150, No. 2, G83, 2003.

Stephane Bertaux et al., "New (oxy)nitride pearlescent pigments", Materials Science and Engineering B 121, 2005, p. 137-144.

* cited by examiner (a)

(b)

METHOD OF MANUFACTURING NON-VOLATILE SEMICONDUCTOR MEMORY ELEMENT AND METHOD OF MANUFACTURING NON-VOLATILE SEMICONDUCTOR MEMORY DEVICE

TECHNICAL FIELD

The present invention relates to a method of manufacturing a non-volatile memory element using a variable resistance element and a method of manufacturing a non-volatile memory device using a variable resistance element.

BACKGROUND ART

In recent years, with the advances in digital technologies employed for electronic apparatuses, large-capacity and non-volatile semiconductor memory devices for storing data, such as music, images, and information, have been actively developed. For example, a non-volatile semiconductor memory device using a ferroelectric as a capacitive element has already been used in many fields. In comparison with such a non-volatile semiconductor memory device using a ferroelectric capacitor, there is a non-volatile semiconductor memory device using a material that changes in resistance in response to the application of an electrical pulse and keeps the resulting state (referred to as the ReRAM hereafter). This ReRAM has received attention because consistency with a usual semiconductor process can be easily ensured (see Patent Literatures 1 and 2, for example).

With the aim of reducing the size and increasing the capacity for a memory element, a cross point ReRAM has been proposed. In the cross point ReRAM, a memory cell is formed at an intersection of an upper line and a lower line. This memory cell has a structure where a variable resistance layer is positioned between an upper electrode and a lower electrode. Moreover, each memory cell includes a diode inserted in series with the variable resistance layer. With this, when a resistance value of the variable resistance layer included in the memory cell is read, this memory cell can avoid influence (such as a leakage current) of another memory cell on a different row or column in a two-dimensional memory cell array.

FIG. 19 is a cross-section diagram showing, as a first example of the aforementioned cross point ReRAM, a non-volatile semiconductor memory device 1000 including a conventional variable resistance element (see Patent Literature 1). More specifically, FIG. 19 is a cross-section diagram of a memory cell 1280 along a bit-line direction, a bit line 1210, and a word line 1220. A variable resistance element 1260 includes: a variable resistance layer 1230 storing information according to an electrical-resistance change in response to an electrical stress; an upper electrode 1240; and a lower electrode 1250. Here, the variable resistance layer 1230 is positioned between the upper electrode 1240 and the lower electrode 1250. A two-terminal nonlinear element 1270 having nonlinear current-voltage characteristics capable of passing current bidirectionally is formed on the variable resistance element 1260. Thus, a series circuit of the variable resistance element 1260 and the nonlinear element 1270 form the memory cell 1280. The nonlinear element 1270 is a two-terminal element, such as a diode, that has the nonlinear current-voltage characteristics whereby a current change is not consistent with a voltage change. Moreover, the bit line 1210 which is the upper line is electrically connected to the nonlinear element 1270, and the word line 1220 which is the lower line is electrically connected to the lower electrode 1250 of the variable resistance element 1260.

As a second example, Patent Literature 2 discloses a specific configuration and manufacturing method of a non-volatile semiconductor memory element into which a diode is inserted in series. The non-volatile semiconductor memory element disclosed in Patent Literature 2 includes: an electrode layer having a diode which is a non-ohmic characteristic element; at least one of an insulator layer or a semiconductor layer; and an interlayer insulating layer. Here, the electrode layer and the insulator or semiconductor layer are filled in a memory cell hole formed in the interlayer insulating layer. With this configuration, a front surface of the non-ohmic element can be formed smooth and flush with the interlayer insulating layer, and thus a favorable interfacial state of the non-ohmic element can be obtained. As a result, a decrease or variations in resistance to pressure due to, for example, electric field concentration can be prevented, and a current capacity can be increased.

CITATION LIST

Patent Literature

[PTL 1]
Japanese Unexamined Patent Application Publication No. 2006-203098
[PTL 2]
International Publication WO 2008/062688

SUMMARY OF INVENTION

Technical Problem

In the device disclosed in Patent Literature 1, the variable resistance element and the diode element are configured in a six-layer stacked structure including the bit line and the word line. When the word line is formed, the nonlinear element, the upper electrode, the variable resistance layer, and the lower electrode are patterned at one time in a direction of the word line. After this, when the bit line positioned as an uppermost layer is formed, the nonlinear element, the upper electrode, the variable resistance layer, and the lower electrode are patterned at one time in a direction of the bit line. As a result, a memory cell is formed only at an intersection of the bit line and the word line. However, using this manufacturing method, the stacked structure of the layers to be patterned becomes thick. Moreover, since plural element films comprising different materials are formed at one time, it is difficult to perform patterning by etching. In other words, this manufacturing method is not suited to miniaturizing a memory cell.

According to the method disclosed in Patent Literature 2, a part of an MIM non-ohmic element is filled in a memory plug. This filling process requires: a process of forming a concave part by eliminating the variable resistance layer formed outside the memory cell hole, by the chemical mechanical polishing (CMP) method and by eliminating a part of the variable resistance layer formed inside the memory cell hole by, for example, overpolishing; and a process of forming an electrode layer and eliminating the electrode layer formed outside the memory cell hole by the CMP process. This leads to a problem that the manufacturing method is complex. Moreover, when the electrode layer is made of a material, such as tantalum, a tantalum alloy, a tantalum nitride, or any other kind of tantalum compound, it is difficult to perform etching because such material is chemically stable. Also, the hardness level of such material is high and, therefore, mechanical polishing performed on this material is not as easy as on copper or a copper alloy that is a wiring material. When, for instance, the hardness level of abrasive grain is raised too high in order to increase a polishing rate during the CMP process, a polishing flaw may be caused and this may result in faulty electrical characteristics. Furthermore, when the grain concentration of an abrasive used in the CMP process is increased, this increases a polishing rate for a silicon dioxide film or the like that is an insulating film, thereby resulting in erosion (i.e., surface damage).

The present invention is conceived to solve the stated conventional problem, and has an object to provide: a method of manufacturing a non-volatile semiconductor memory element suited to miniaturization, able to be manufactured by an easy process, small in element-to-element variations, capable of a stable operation, and suited to capacity enlargement and a high degree of integration; and a method of manufacturing a non-volatile semiconductor memory device.

Solution to Problem

In order to achieve the aforementioned object, the method of manufacturing the non-volatile semiconductor memory element in an aspect according to the present invention is a method of manufacturing a non-volatile semiconductor memory element including a variable resistance element and a non-ohmic element connected in series with the variable resistance element, the variable resistance element including (i) a first electrode, (ii) a variable resistance layer formed on the first electrode, and (iii) a shared electrode formed in an upper part of the variable resistance layer, the non-ohmic element including (i) the shared electrode, (ii) one of a semiconductor layer and an insulator layer formed on the shared electrode, and (iii) a second electrode formed on the one of the semiconductor layer and the insulator layer, and the method including: forming the first electrode on a substrate; forming the variable resistance layer on the first electrode, the variable resistance layer comprising a transition metal oxide; forming the shared electrode by nitriding a front surface of the variable resistance layer; forming the one of the semiconductor layer and the insulator layer on the shared electrode; and forming the second electrode on the one of the semiconductor layer and the insulator layer, wherein, in the forming of the shared electrode, a front surface of the transition metal oxide is nitrided according to a plasma nitriding process so as to form the shared electrode comprising a transition metal nitride.

In the case of the method of manufacturing a shared electrode according to a conventional filling process, a series of processes are performed to: form a concave part by eliminating a part of the variable resistance layer formed inside the memory cell hole, by, for example, overpolishing or dry etching; and form an electrode film and then eliminate an unnecessary part of the electrode film by the CMP process. On the other hand, according to the manufacturing method according to the present invention, the oxygen atoms in the variable resistance layer are replaced by the nitrogen atoms only via the plasma nitriding process. Therefore, a method of manufacturing a non-volatile semiconductor memory device can be simplified. Moreover, since the CMP process does not need to be repeated, the front surface of the electrode layer is flat and thus variations in device characteristics can be reduced.

Furthermore, the shared electrode formed by the nitriding process according to this manufacturing method has a high barrier property against oxygen diffused from the variable resistance layer comprising the transition metal oxide to the semiconductor or insulator layer. Thus, the film thickness can be reduced as compared with the conventional shared electrode, meaning that the present shared electrode is useful in miniaturization. In particular, a shared electrode layer having a high nitrogen density can be formed at a low temperature by using the plasma nitriding process as a nitriding process. This improves the barrier characteristics, and the shared electrode can be thus thinned. Moreover, the plasma nitriding method can uniformly control a plasma distribution state by an external magnetic field effect. Thus, variations in film thickness of the shared electrode can be reduced by high in-plane uniformity, thereby significantly reducing in-plane variations in characteristics of the non-volatile memory element.

Moreover, it is preferable for the transition metal oxide to be one of a tantalum oxide and a hafnium oxide, and it is preferable for a front surface of the one of the tantalum oxide and the hafnium oxide to be nitrided so as to form the shared electrode comprising a corresponding one of a tantalum nitride and a hafnium nitride.

Furthermore, the variable resistance layer may include: a first transition metal oxide layer formed on the first electrode; and a second transition metal oxide layer that is formed on the first transition metal oxide layer and has a lower oxygen content atomic percentage than the first transition metal oxide.

This configuration can implement a non-volatile memory element that uses a resistance change phenomenon and has a property of performing reversibly stable rewriting.

The method of manufacturing the non-volatile semiconductor memory device in an aspect according to the present invention is a method of manufacturing a cross point non-volatile semiconductor memory device including a plurality of non-volatile semiconductor memory elements arranged in an array, each of the non-volatile semiconductor memory elements having a variable resistance element and a non-ohmic element connected in series with the variable resistance element, the variable resistance element including (i) a lower electrode line formed to be shared by, among the non-volatile semiconductor memory elements arranged in the array, non-volatile semiconductor memory elements arranged in a first direction, (ii) a variable resistance layer formed on the lower electrode line, and (iii) a shared electrode formed in an upper part of the variable resistance layer, the non-ohmic element including (i) the shared electrode, (ii) one of a semiconductor layer and an insulator layer formed on the shared electrode, and (iii) an upper electrode formed on the one of the semiconductor layer and the insulator layer, and the method including: forming, on a substrate, a plurality of lower electrode lines in parallel in the first direction; forming an interlayer insulating layer on the substrate including the lower electrode lines; forming a plurality of memory cell holes in the interlayer insulating layer formed on the lower electrode lines; filling a transition metal oxide included in the variable resistance layer into the memory cell holes; forming the shared electrode by nitriding a front surface of the variable resistance layer; and forming, on the shared electrode and the interlayer insulating layer, the semiconductor or insulator layer and the upper electrode to be shared by, among the non-volatile semiconductor memory elements arranged in the array, non-volatile semiconductor memory elements arranged in a second direction different from the first direction, each of widths of the formed semiconductor or insulator layer and the formed upper electrode being greater than a width of the shared electrode, and each of the semiconductor or insulator layer and the upper electrode being plurally formed in parallel corresponding to the non-volatile semiconductor memory elements arranged in the second direction, wherein, in the forming of the shared electrode, a front surface of the transition metal oxide is nitrided according to a plasma nitriding process so as to form the shared electrode comprising a transition metal nitride.

With this manufacturing method, the conventional filling process requiring a series of processes is replaced only by the nitriding process. More specifically, the conventional series of processes include: forming a concave part by eliminating a part of the variable resistance layer formed inside the memory cell hole, by, for example, overpolishing or dry etching; and forming an electrode film and then eliminating an unnecessary part of the electrode film by the CMP process. Therefore, with this manufacturing method according to the present invention, a method of manufacturing a non-volatile semiconductor memory device can be simplified. Moreover, the front surface of the electrode layer is flat and thus variations in device characteristics are expected to be reduced. In particular, the shared electrode layer having a high nitrogen density can be formed at a low temperature by using the plasma nitriding process as a nitriding process. This improves the barrier characteristics, and the shared electrode can be thus thinned. Moreover, the plasma nitriding method can uniformly control a plasma distribution state by an external magnetic field effect. Thus, variations in film thickness of the shared electrode can be reduced by high in-plane uniformity, thereby significantly reducing in-plane variations in characteristics of the non-volatile memory element.

Moreover, it is preferable for the transition metal oxide to be one of a tantalum oxide and a hafnium oxide, and it is preferable for a front surface of the one of the tantalum oxide and the hafnium oxide to be nitrided so as to form the shared electrode comprising a corresponding one of a tantalum nitride and a hafnium nitride.

Furthermore, the variable resistance layer may include: a first transition metal oxide layer formed on the first electrode; and a second transition metal oxide layer that is formed on the first transition metal oxide layer and has a lower oxygen content atomic percentage than the first transition metal oxide.

This configuration can implement a non-volatile semiconductor memory device that uses a resistance change phenomenon and has a property of performing reversibly stable rewriting.

The non-volatile semiconductor memory device in an aspect according to the present invention is a method of manufacturing a cross point non-volatile semiconductor memory device including a plurality of non-volatile semiconductor memory elements arranged in an array, each of the non-volatile semiconductor memory elements having a variable resistance element and a non-ohmic element connected in series with the variable resistance element, the variable resistance element including (i) a lower electrode line formed to be shared by, among the non-volatile semiconductor memory elements arranged in the array, non-volatile semiconductor memory elements arranged in a first direction, (ii) a variable resistance layer formed on the lower electrode line, and (iii) a shared electrode formed in an upper part of the variable resistance layer, the non-ohmic element including (i) the shared electrode, (ii) one of a semiconductor layer and an insulator layer formed on the shared electrode, and (iii) an upper electrode formed on the one of the semiconductor layer and the insulator layer, and the method including: (a) forming, on a substrate, a plurality of lower electrode lines in parallel in the first direction; (b) forming a first interlayer insulating layer on the substrate including the lower electrode lines; (c) forming a plurality of first memory cell holes in the first interlayer insulating layer formed on the lower electrode lines; (d) filling a transition metal oxide included in the first variable resistance layer into the first memory cell holes; (e) forming a plurality of first shared electrodes by nitriding front surfaces of the plurality of first variable resistance layers; (f) forming, on the first shared electrode and the first interlayer insulating layer, the first semiconductor or insulator layer and the first upper electrode to be shared by, among the non-volatile semiconductor memory elements arranged in the array, non-volatile semiconductor memory elements arranged in a second direction different from the first direction, each of widths of the formed first semiconductor or insulator layer and the formed first upper electrode being greater than a width of the first shared electrode, and each of the first semiconductor or insulator layer and the first upper electrode being plurally formed in parallel corresponding to the non-volatile semiconductor memory elements arranged in the second direction; (g) forming an insulation protection layer on an area, out of a region of the first interlayer insulating layer, where the first semiconductor or insulator layer and the first upper electrode are not formed; (h) forming a second interlayer insulating layer on the insulation protection layer; (i) forming a plurality of second memory cell holes in the second interlayer insulating layer formed on the first upper electrode; (j) filling a transition metal oxide included in the second variable resistance layer into the second memory cell holes; (k) forming a plurality of second shared electrodes by nitriding front surfaces of the second variable resistance layers; and (l) forming, on the second shared electrode and the second interlayer insulating layer, the second semiconductor or insulator layer and the second upper electrode to be shared by, among the non-volatile semiconductor memory elements arranged in the array, the non-volatile semiconductor memory elements arranged in the first direction, each of widths of the formed second semiconductor or insulator layer and the formed second upper electrode being greater than a width of the second shared electrode, and each of the second semiconductor or insulator layer and the second upper electrode being plurally formed in parallel corresponding to the non-volatile semiconductor memory elements arranged in the first direction, wherein, in each of the forming of the plurality of first shared electrodes by nitriding the front surfaces of the plurality of first variable resistance layers and the forming of the plurality of second shared electrodes by nitriding the front surfaces of the second variable resistance layers, a front surface of the transition metal oxide is nitrided according to a plasma nitriding process so as to form the shared electrode comprising a transition metal nitride, and processes (a) to (l) correspond to a basic unit of processing, and a plurality of stacked structures are formed by repeating (b) to (l) after performing (l), each of the stacked structures including the variable resistance element and the non-ohmic element stacked on the variable resistance element.

Moreover, it is preferable for the transition metal oxide to be one of a tantalum oxide and a hafnium oxide, and it is preferable for a front surface of the one of the tantalum oxide and the hafnium oxide to be nitrided so as to form the shared electrode comprising a corresponding one of a tantalum nitride and a hafnium nitride.

Furthermore, the variable resistance layer may include: a first transition metal oxide layer formed on the first electrode; and a second transition metal oxide layer that is formed on the first transition metal oxide layer and has a lower oxygen content atomic percentage than the first transition metal oxide.

This manufacturing method can easily implement a higher-capacity non-volatile semiconductor memory device.

Advantageous Effects of Invention

Each of the methods of manufacturing the non-volatile semiconductor memory element and the non-volatile semiconductor memory device according to the present invention form, in a memory cell where a non-ohmic element is formed in series with a variable resistance element (that is, one memory cell is formed by one non-ohmic element and one variable resistance element), a shared electrode layer that serves as both an upper electrode layer of a variable resistance layer and a lower electrode layer of a non-ohmic element. The shared electrode layer is formed by performing a nitriding process on an upper surface of the variable resistance layer. Thus, the methods can form a structurally-simple memory cell, obtain convenient and stable characteristics as a manufacturing method, and obtain an electrode layer superior in preventing a leak current of the non-ohmic element and preventing diffusion of oxygen ions from the variable resistance layer. Moreover, since the variable resistance layer, the shared electrode layer, and the semiconductor or insulator layer of the non-ohmic element are sequentially formed, the thickness of the shared electrode layer can be reduced. On account of this, the manufacturing methods are suited to miniaturization.

Furthermore, since the shared electrode layer can be formed by being filled in the memory cell hole, the manufacturing process such as the CMP process can be simplified. Also, an interfacial surface between the shared electrode layer and the semiconductor or insulator layer can be formed flat. Therefore, as great advantageous effects, the current capacity can be increased and the characteristics of the non-ohmic element can be stabilized. Moreover, the shared electrode having a high nitrogen density can be formed at a low temperature by the plasma nitriding process employed as a nitriding process. Thus, the shared electrode can be significantly thinned, and is useful for miniaturization. Moreover, the plasma nitriding process can uniformly control a plasma state by, for example, an external magnetic field effect. Thus, variations in film thickness of the shared electrodes can be reduced, thereby reducing in-plane variations in characteristics of the non-volatile memory element.

DESCRIPTION OF EMBODIMENTS

The following is a description of Embodiments according to the present invention, with reference to the drawings. It should be noted that identical components are assigned the same reference sign and that explanations of these identical components may not be repeated. Moreover, note that a transistor, a variable resistance element, and the like are shown in schematic forms and that each of the numbers of these components shown is determined only for ease of illustration.

Embodiment 1

Figure 1:
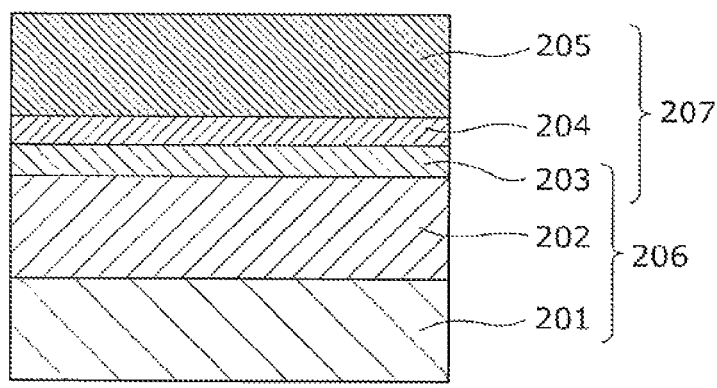
FIG. 1 is a cross-section diagram showing an example of a configuration of a memory cell where a variable resistance non-volatile memory element and a non-ohmic element (a diode in this example) are connected in series, in Embodiment 1 according to the present invention.
Figure 1:
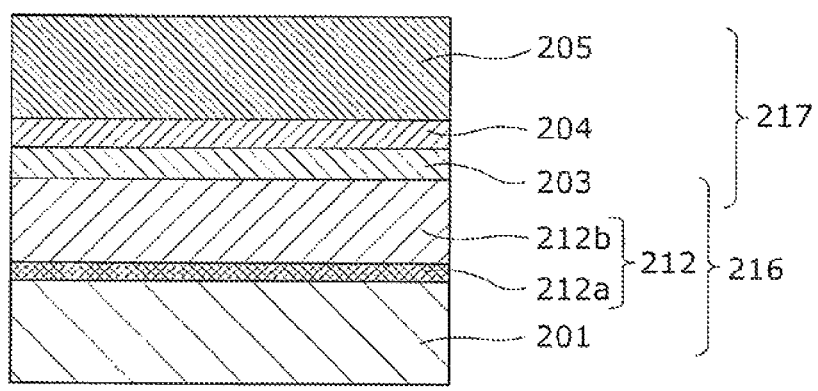

In FIG. 1, (a) is a cross-section diagram showing an example of a configuration of a memory cell (namely, a variable resistance non-volatile memory element) 200 where a variable resistance element and a non-ohmic element are connected in series, in Embodiment 1 according to the present invention.

[Configuration of Memory Cell]

As shown in (a) of FIG. 1, the memory cell (a non-volatile semiconductor memory element) 200 in Embodiment 1 includes: a variable resistance element 206 including a first electrode 201 and a shared electrode 203 with a variable resistance layer 202 being positioned between these two electrodes; and a non-ohmic element 207 including the shared electrode 203 and a second electrode 205 with a semiconductor or insulator layer 204 being positioned between these two electrodes. The variable resistance element 206 and the non-ohmic element 207 are connected in series, with the shared electrode 203 being positioned therebetween. It should be noted here that the first electrode 201 is formed on a substrate (not shown).

Here, the variable resistance layer 202 of the variable resistance element 206 comprises an oxygen-deficient transition metal oxide. Suppose that transition metal and oxygen are represented respectively by "M" and "O", and that transition metal oxide is thus represented by "$MO_x$". The oxygen-deficient transition metal oxide refers to an oxide where the number of oxygen atoms represented by "x" of the oxygen O is smaller than the case of a stoichiometrically-stable state (normally resulting in an insulator). As the oxygen-deficient transition metal oxide, an oxide using a metal out of various kinds of transition metals can be used. For example, by using a variable resistance layer comprising a tantalum oxide ($TaO_x$ where $0<x<2.5$) or a hafnium oxide ($HfO_x$ where $0<x<2.0$), the non-volatile memory element can be obtained that uses a resistance change phenomenon and has a property of performing reversibly stable rewriting. The present applicant has already filed related patent applications for the non-volatile memory element comprising the aforementioned materials. More specifically, the tantalum oxide is described in detail in International Publication WO 2008/059701, and the hafnium oxide is described in detail in International Publication WO 2009/050861.

The variable resistance layer 202 may be formed of a single layer as shown in (a) of FIG. 1. Alternatively, as shown in (b) of FIG. 1, two layers may form a variable resistance layer 212. As shown in (b) of FIG. 1, an oxygen-deficient transition metal oxide included in the variable resistance layer 212 includes at least: a first variable resistance layer 212a that is a high-concentration oxygen layer; and a second variable resistance layer 212b that is a low-concentration oxygen layer. Here, the first variable resistance layer 212a that is a high-concentration oxygen layer is positioned on a side where the first electrode 201 is connected. The present applicant has already filed a related patent application for the structure of stacking two transition metal oxide layers. More specifically, the stacked structure of the tantalum oxide is described in detail in International Publication WO 2008/149484.

In Embodiment 1, when the tantalum oxide is used as the oxygen-deficient transition metal oxide, the oxygen content atomic percentage of the first variable resistance layer ($TaO_y$: the high concentration oxygen layer) 212a is 68 atm % to 71 atm % (where $2.1 \leq y < 2.5$) and the oxygen content atomic percentage of the second variable resistance layer ($TaO_x$: the low concentration oxygen layer) 212b is 45 atm % to 65 atm % (where $0.8 \leq x \leq 1.9$). Similarly, when the hafnium oxide is used, the oxygen content atomic percentage of the first variable resistance layer ($HfO_y$: the high concentration oxygen layer) is 64 atm % to 67 atm % (where $1.8 < y \leq 2.0$) and the oxygen content atomic percentage of the second variable resistance layer ($HfO_x$: the low concentration oxygen layer) is 47 atm % to 62 atm % (where $0.9 \leq x \leq 1.6$). When $TaO_y$ is used as the transition metal oxide, it is preferable for the thickness of the first variable resistance layer (the high concentration oxygen layer) to be between 1 nm and 8 nm inclusive. When $HfO_y$ is used as the transition metal oxide, it is preferable for the thickness of the first variable resistance layer (the high concentration oxygen layer) to be between 3 nm and 4 nm inclusive. This is because, in both of these cases, when the first variable resistance layer becomes thicker, an initial breakdown voltage to be applied immediately after manufacturing is unfavorably increased, thereby damaging the non-ohmic element 207. Moreover, it is preferable for the variable resistance layer 212 to have an increased oxygen content atomic percentage near the first electrode 201 in order for a resistance change to easily appear in response to oxidation and reduction in the interfacial surface of the first electrode 201. With this, a favorable property of a memory cell capable of low-voltage driving can be obtained.

For the first electrode 201 included in the variable resistance element 206, platinum (Pt), iridium (Ir), or the like is used. The standard electrode potential of each of platinum and iridium is 1.2 eV, for example. In general, the standard electrode potential is one of measures indicating the susceptibility to oxidation. When the standard electrode potential is higher, the current material is less oxidizable. On the other hand, when the standard electrode potential is lower, the material is more oxidizable. When a difference in the standard electrode potential is larger between the electrode and the variable resistance layer, it is easier for a resistance change to occur. In other words, as the difference is reduced, it is harder for a resistance change to occur. On account of this, it is estimated that the susceptibility of the variable resistance material to be oxidized with an electrode material plays a great role in a mechanism of a resistance change phenomenon. The standard electrode potential indicating the susceptibility to oxidation-reduction of tantalum is −0.6 eV, and the standard electrode potential of hafnium is −1.5 eV. These standard electrode potentials are lower than those of platinum and iridium (that is, +1 V or higher, such as 1.2 eV as mentioned above). Therefore, in the interfacial surface between the first electrode 201 comprising platinum or iridium and the variable resistance layer 202, an oxidation-reduction reaction of the tantalum oxide or the hafnium oxide occurs. Thus, oxygen is given and received, thereby causing a resistance change phenomenon. The corresponding tantalum or hafnium oxide changes from a low resistance state to a high resistance state in response to the application of a voltage that is higher than or equal to a first threshold of a first polarity. Then, the tantalum or hafnium oxide changes from the high resistance state to the low resistance state in response to the application of a voltage that is higher than or equal to a second threshold of a second polarity different from the first polarity. In other words, the tantalum or hafnium oxide shows bipolar variable resistance property.

On the other hand, the non-ohmic element 207 needs to have a property such that a voltage required for writing or reading is applied to a selected variable resistance element 206 and that the voltage required for writing or reading is not applied to an unselected variable resistance element 206. To be more specific, it is necessary for a threshold of the non-ohmic element 207 (a value of voltage at which the non-ohmic element 207 is turned ON or OFF) to be: smaller than a voltage to be applied to the non-ohmic element 207 connected to the selected variable resistance element 206 (that is, the selected non-ohmic element 207 is in an ON state); and greater than a voltage to be applied to the non-ohmic element 207 connected to the unselected variable resistance element 206 (that is, the unselected non-ohmic element 207 is in an OFF state).

Moreover, the variable resistance element 206 comprising the tantalum oxide or the hafnium oxide has the bipolar variable resistance property. Hence, the non-ohmic element 207 used in Embodiment 1 also needs to have a bipolar property (showing the ON state and the OFF state in each of positive and negative cases).

Currently-known examples of the bipolar non-ohmic element 207 include a metal-semiconductor-metal (MSM) diode, a metal-insulator-metal (MIM) diode, and a varistor.

In manufacturing, as characteristics of a diode to be used as a 1D1R variable resistance non-volatile memory element, I-V characteristics need to be stable and a current required for a resistance change can be sent ("1D1R" refers to a structure where one memory cell is formed by one diode and one variable resistance element). The varistor uses a crystal grain boundary to present nonlinear characteristics and, for this reason, has a problem of being unstable in manufacturing. The MSM diode and the MIM diode have no problem in stability in manufacturing as long as the stable state of the interfacial surface between the corresponding MSM or MIM and the electrode can be obtained. However, the amount of current that can be sent is greater in the case of using the MSM diode employing a semiconductor layer. In general, the variable resistance non-volatile memory element requires a great amount of current for a resistance change. On this account, the MSM diode is more preferable. Nevertheless, when miniaturization allows a resistance change to occur by a small amount of current, the MIM diode can be used as well. Embodiment 1 describes the case where the MSM diode is used as an example of the non-ohmic element 207.

For the semiconductor layer 204 of the MSM diode (non-ohmic element) 207, it is preferable to use, for example, a nitrogen-deficient silicon nitride ($SiN_z$ where $0<z\leq 0.85$). By moderately nitriding silicon that is originally a semiconductive material, a conductive property and thermal stability can be obtained. Moreover, as an electrode material of the MSM diode employing $SiN_z$ as the semiconductor layer 204, it is preferable to use a refractory metal material or a nitride of the refractory metal material. To be more specific, it is preferable to use tantalum nitride (TaN), titanium nitride (TiN), or tungsten (α-W) having a body-centered cubic lattice (bcc) structure, for example. This is because, during manufacturing, it is hard for the electrode material to diffuse into the semiconductor layer 204 because of heat generated by the passage of a current, meaning that stable non-ohmic I-V characteristics are presented and that resistance to the breakdown voltage is high.

[Manufacturing Method]

As shown in (a) of FIG. 1, the 1D1R memory cell (non-volatile semiconductor memory element) 200 in Embodiment 1 has the configuration where the variable resistance element 206 comprising the oxygen-deficient tantalum oxide and the non-ohmic element 207 are connected in series. The variable resistance element 206 can be formed according to the manufacturing process disclosed in International Publication WO 2008/059701 mentioned above. The following describes methods which are added to Embodiment 1 to form the shared electrode 203 and the semiconductor layer 204 of the non-ohmic element 207 included in the memory cell 200.

In (a) of FIG. 1, after the first electrode 201 comprising a tantalum nitride is formed on a substrate (not shown), the variable resistance layer 202 comprising a tantalum oxide ($0<x<2.5$ when represented by $TaO_x$) is formed.

Figure 2:
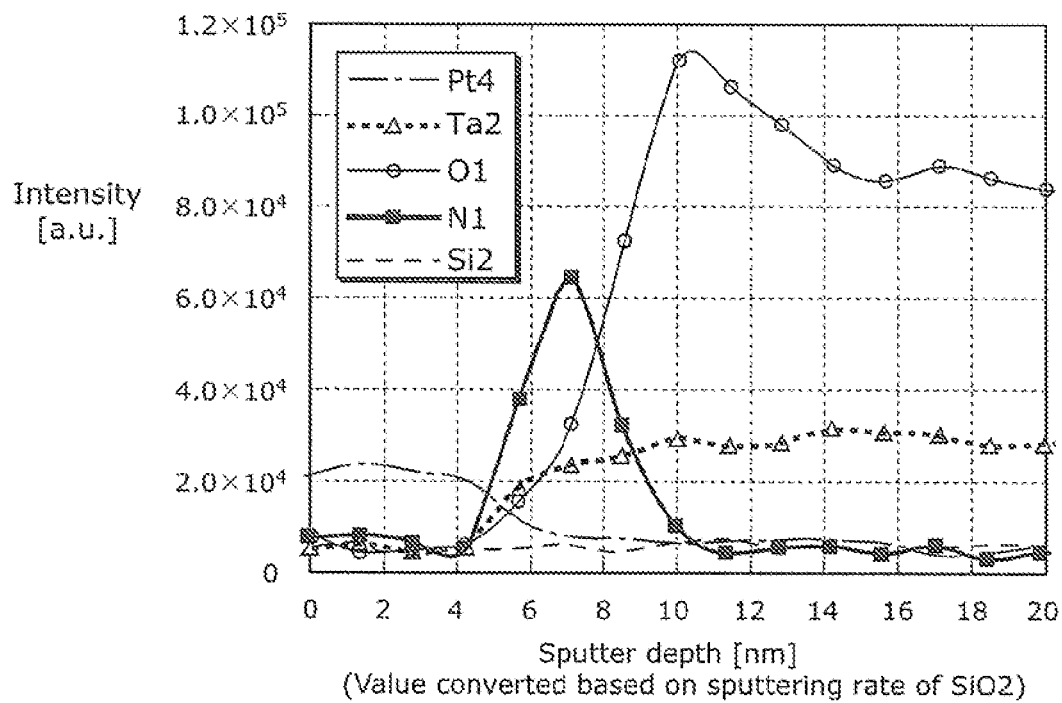
FIG. 2 is a diagram showing profiles in a thickness direction obtained by Auger analysis when a plasma nitriding process is performed on a variable resistance layer.

Next, a front surface part of the variable resistance layer 202 comprising the tantalum oxide ($TaO_x$) is nitrided by the plasma nitriding process to form the shared electrode 203 comprising a tantalum nitride (TaN). The plasma nitriding process is implemented by processing, using nitrogen plasma, a wafer maintained held at 400 degrees centigrade. Conditions for the plasma nitriding are that: an RF power is 500 W; a flow rate of nitrogen is 0.5 SLM; and a processing time is 180 seconds. FIG. 2 shows a result of Auger analysis in a depth direction of a sample when the plasma nitriding process is performed. It should be noted that, the configuration of the sample used in the analysis includes: Pt (10 nm thick), TaN, $TaO_x$ (X=0.72 and the thickness is 50 nm), SiN (100 nm thick), and an Si substrate. Here, Pt is formed in order to prevent a change in a front surface layer.

FIG. 2 is a diagram showing profiles of atoms in the thickness direction obtained by Auger analysis when the plasma nitriding process is performed on the variable resistance layer 202. The horizontal axis in FIG. 2 indicates a depth from the front surface of the variable resistance element 206, the depth being converted on the basis of a time period taken for etching $SiO_2$ (that is, a sputtering rate). As shown in FIG. 2, by the plasma nitriding process, a peak of nitrogen atoms is predominant as compared with that of oxygen atoms on the front surface of the variable resistance layer 202. When a half-value width of the peak is considered to be a film thickness, it can be seen that the tantalum nitride layer (shared electrode) 203 having a thickness of about 3 nm has been formed. More specifically, the tantalum oxynitride having a greater nitrogen content atomic percentage than an oxygen content atomic percentage is formed on the front surface of the tantalum oxide film. In this way, the shared electrode 203 serving as both the upper electrode of the variable resistance layer 202 and the lower electrode of the semiconductor layer 204 can be formed at one time. Moreover, the shared electrode 203 can prevent the semiconductor layer 204 from oxidizing caused by the diffusion of oxygen from the variable resistance layer 202 to the semiconductor layer 204. Here, a work function of a tantalum nitride is 4.6 eV which is sufficiently higher than 3.8 eV that is an electron affinity of silicon. Accordingly, a Schottky barrier is formed in the interfacial surface between the semiconductor layer 204 and the second electrode 205. As a result, the oxygen diffusion between the variable resistance layer 202 and the semiconductor layer 204 is reduced and, therefore, favorable diode characteristics can be obtained. As can be seen from FIG. 2, in a region where the sputter depth on the horizontal axis is 4 nm to 8 nm, the intensity of oxygen on the vertical axis is lower than the intensity of oxygen of the tantalum oxide formed at first (a region of 14 nm to 20 nm). This means that oxygen atoms on the front surface of the tantalum oxide are replaced by nitrogen atoms. It should be noted that a film formed by nitriding the front surface of the tantalum oxide film is technically a tantalum oxynitride film. However, since the nitrogen content atomic percentage is higher than the oxygen content atomic percentage, the current film is referred to as the tantalum nitride (TaN).

Next, regarding the conditions of the plasma nitriding process performed on the variable resistance layer 202, three points respectively about the wafer heating temperature, the processing time, and the plasma power are described.

Figure 3:
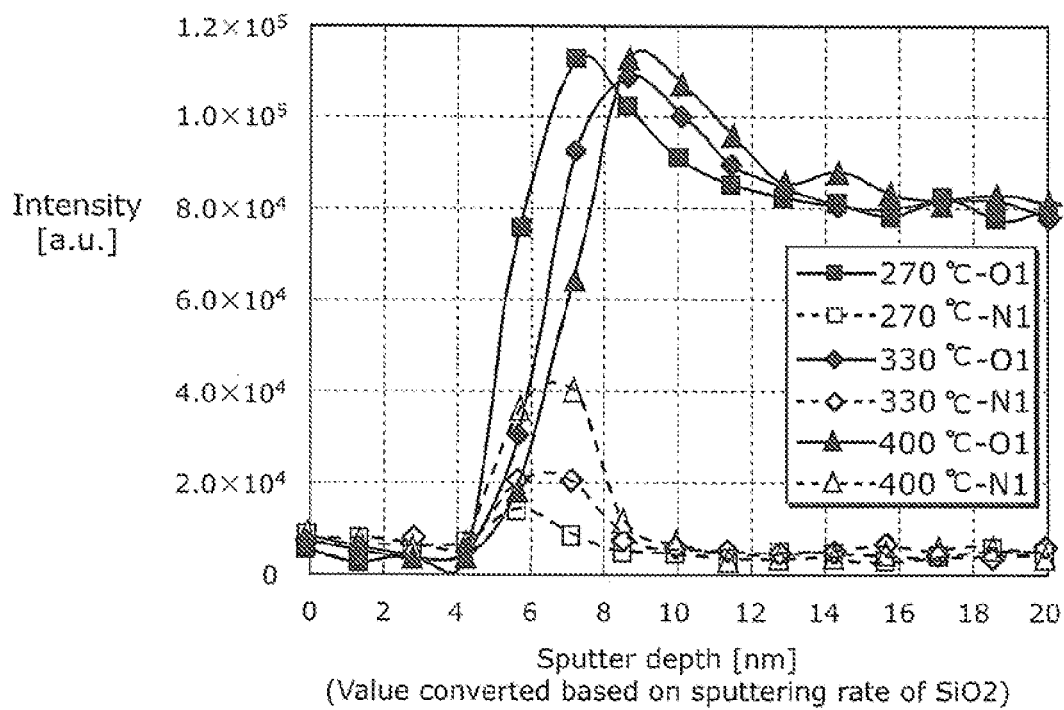
FIG. 3 is a diagram showing profiles in the thickness direction obtained by Auger analysis when the plasma nitriding process is performed on the variable resistance layer in the cases where substrate heating temperatures are maintained at 270, 330, and 400 degrees centigrade.
Figure 4:
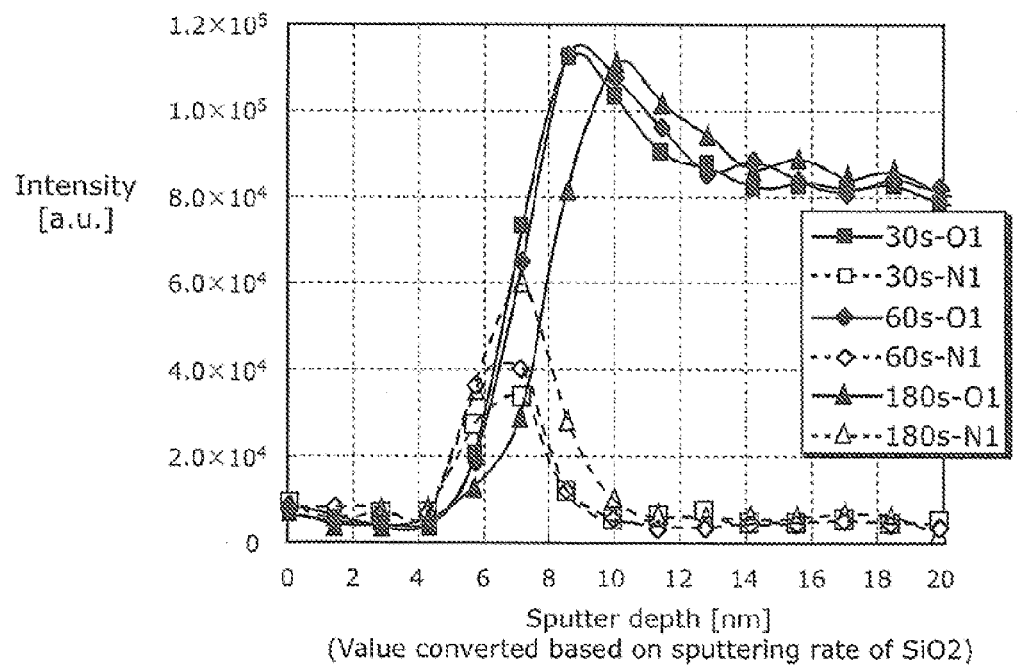
FIG. 4 is a diagram showing profiles in the thickness direction obtained by Auger analysis in the cases where the plasma nitriding process is performed on the variable resistance layer for 30, 60, and 180 seconds.
Figure 5:
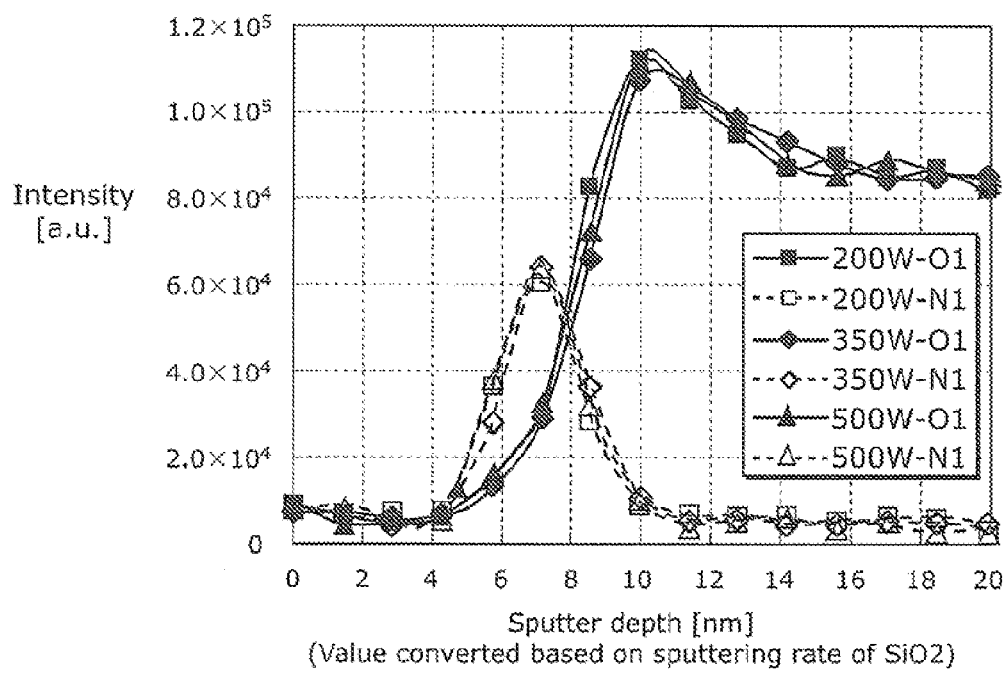
FIG. 5 is a diagram showing profiles in the thickness direction obtained by Auger analysis when the plasma nitriding process is performed on the variable resistance layer in the cases where plasma power is set at 200 W, 350 W, and 500 W.

FIG. 3 is a diagram showing profiles in the thickness direction obtained by Auger analysis when the plasma nitriding process is performed on the variable resistance layer 202 in the cases where substrate heating temperatures are maintained at 270, 330, and 400 degrees centigrade. FIG. 4 is a diagram showing profiles in the thickness direction obtained by Auger analysis in the cases where the plasma nitriding process is performed on the variable resistance layer 202 for 30, 60, and 180 seconds. FIG. 5 is a diagram showing profiles in the thickness direction obtained by Auger analysis when the plasma nitriding process is performed on the variable resistance layer 202 in the cases where the plasma power is set at 200 W, 350 W, and 500 W.

From the profiles of oxygen and nitrogen obtained when the substrate heating temperature is changed, a peak of oxygen atoms is predominant as compared with that of nitrogen atoms when the substrate heating temperature is 270 degrees centigrade and 330 degrees centigrade. To be more specific, it is understood that a tantalum nitride layer that is adequately nitrided is not formed. In addition, when the wafer heating temperature is 270 degrees centigrade, a half-value width of the peak of nitrogen atoms is small and it is thus understood that the nitrided layer formed on the surface of the variable resistance layer 202 is thin. On the other hand, when the wafer heating temperature is 400 degrees centigrade, the peak of nitrogen atoms is predominant as compared with that of oxygen atoms near the front surface of the variable resistance layer 202. When a half-value width of the peak is considered to be a film thickness, it can be definitely seen that the tantalum nitride layer (shared electrode) 203 having the thickness of about 3 nm has been formed. From the above result, it is preferable for the plasma processing temperature to be high. In consideration of an influence on device characteristics, 400 degrees centigrade or so is appropriate as the substrate heating temperature in the plasma nitriding process.

The following describes the influence of the plasma processing time when the wafer heating temperature and the plasma power are maintained at 400 degrees centigrade and 500 W, respectively. As shown in FIG. 4, the peak intensity of the nitrogen atoms increases as the plasma nitriding time progresses, and a region where the peak of nitrogen atoms is predominant as compared with that of oxygen atoms is enlarged near the front surface of the variable resistance layer 202. On this account, it is preferable for the processing time to be longer. For example, in the case shown in FIG. 4, 180 seconds is considered preferable.

Here, the plasma power is explained. Suppose that the substrate heating temperature is 400 degrees centigrade, that the processing time is 180 seconds, and that the plasma power is set at 200 W, 350 W, and 500 W. As shown in FIG. 5, the intensities of the peaks of the nitrogen atoms in the cases of these different plasma powers are approximately the same. In other words, the plasma power has a low influence on the thickness of the nitrided film.

The method of forming the shared electrode 203 according to the plasma nitriding process can form, at a low temperature, a nitrided film having a high nitrogen density even though the film is thin, by replacing the oxygen atoms of the tantalum oxide film by the nitrogen atoms. Therefore, the process of forming the shared electrode 203 by the plasma nitriding as in Embodiment 1 can reduce the thickness of the shared electrode 203. As a result, the configuration described in Embodiment 1 is useful in that even a structure formed by stacking a plurality of materials can be adapted to miniaturization. Moreover, the plasma nitriding process can uniformly control a plasma state by an external magnetic field effect and, thus, in-plane variations in film thickness of the shared electrode 203 can be reduced. Accordingly, the configuration described in Embodiment 1 is useful in that in-plane variations in characteristics of the non-volatile memory element can be reduced.

Next, the method of forming the semiconductor layer 204 included in the diode element (non-ohmic element) 207 is described.

For the semiconductor layer 204 included in the diode element 207, nitrogen-deficient silicon nitride film ($SiN_z$ where $0<z\leq0.85$) is used. For the second electrode 205, a tantalum nitride (TaN) is used. Here, the nitrogen-deficient silicon nitride film is a silicon nitride film having a lower nitrogen content atomic percentage than a silicon nitride film ($Si_3N_4$) that is stoichiometrically stable. When the nitrogen content atomic percentage is low, a semiconducting property is presented.

The nitrogen-deficient silicon nitride film is formed according to a method of sputtering, for example, a polycrystalline silicon target under a gas atmosphere mixed with argon and nitrogen. This method is the so-called "reactive sputtering" method. Here, typical conditions for forming the film are that: a pressure is set at 0.08 Pa to 2 Pa; the substrate temperature is set at 20 degrees centigrade to 300 degrees centigrade; a flow rate of nitrogen gas (a ratio of nitrogen flow volume to a total flow volume of argon and nitrogen) is 1% to 40%; and a DC power is set at 100 W to 1300 W. Then, the film forming time is adjusted so that the thickness of the nitrogen-deficient silicon nitride film is 5 nm to 20 nm. In this way, a $SiN_z$ film where $0<z<1.4$ is formed.

Here, a work function of a tantalum nitride is about 4.6 eV which is sufficiently higher than 3.8 eV that is an electron affinity of silicon. Accordingly, a Schottky barrier is formed in the interfacial surface between the semiconductor layer 204 and the second electrode 205. In the present configuration where each of the second electrode 205 and the shared electrode 203 comprises a tantalum nitride (TaN), the diode element 207 functions as a bipolar MSM diode.

As described, each of the methods of manufacturing the non-volatile semiconductor memory element and the non-volatile semiconductor memory device in an aspect according to the present invention form, in the memory cell where the non-ohmic element is formed in series with the variable resistance element (that is, one memory cell is formed by one non-ohmic element and one variable resistance element), the shared electrode layer that serves as both the upper electrode layer of the variable resistance layer and the lower electrode layer of the non-ohmic element. The shared electrode layer is formed by performing the nitriding process on the upper surface of the variable resistance layer. Since the variable resistance layer, the shared electrode layer, and the semiconductor layer (or the insulator layer) of the non-ohmic element are sequentially formed, the manufacturing method is simplified. Moreover, the manufacturing method can obtain the electrode layer superior in preventing a leak current of the non-ohmic element and preventing diffusion of oxygen ions from the variable resistance layer. Thus, the thickness of the shared electrode layer can be reduced. On account of this, the manufacturing method is suited to miniaturization.

Figure 19:
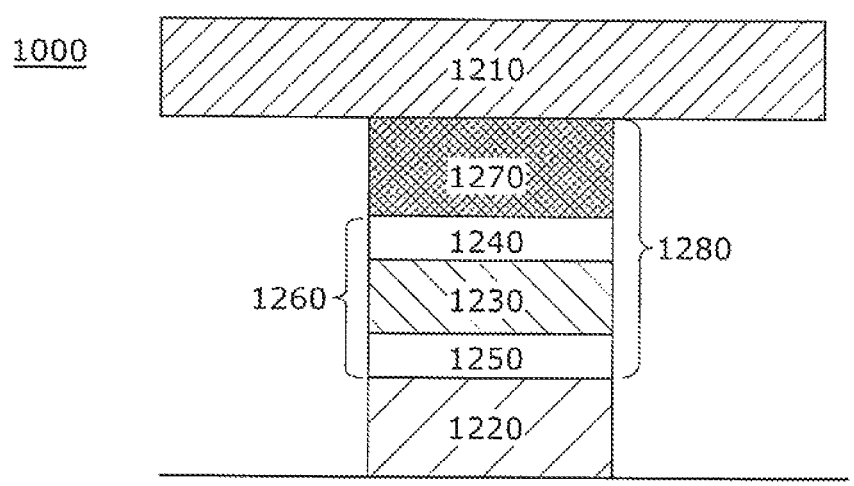
FIG. 19 is a diagram showing an example of a configuration of a conventional variable resistance non-volatile semiconductor memory device.

As shown in (a) of FIG. 1, the non-volatile memory element 200 in Embodiment 1 can be formed in a five-layer stacked structure. On the other hand, the example of the conventional structure explained with reference to FIG. 19 is described as employing, as the nonlinear element 1270, a two-terminal nonlinear element having nonlinear current-voltage characteristics capable of passing current bidirectionally. Thus, an MSM diode seems to be intended as the nonlinear element. To be more specific, the memory cell according to the conventional technology requires a six-layer structure whereas the memory cell in Embodiment 1 has the five-layer structure. As compared with the element structure in the conventional example shown in FIG. 19, the number of stacked layers can be reduced by one in Embodiment 1. Moreover, the thickness of the shared electrode formed by the plasma nitriding process can be reduced as compared with the case where the shared electrode is formed without using the plasma nitriding process. Accordingly, this is effective in miniaturization.

Embodiment 1 has described the case where the MSM diode employing $SiN_z$ (where $0<z\leq0.85$) is used as the semiconductor layer 204. However, it should be noted that the present invention is not limited to this. For example, tantalum pentoxide ($Ta_2O_5$), alumina ($Al_2O_3$), or titania ($TiO_2$) that is an insulator may be used instead of the semiconductor layer, so as to implement an MIM diode including the shared electrode 203, the insulator layer 204, and the second electrode 205. When $Ta_2O_5$ is used, any film-forming method may be employed. Examples of the method include: a method of forming a film according to the CVD method; and a method of directly forming a $Ta_2O_5$ film by sputtering using a $Ta_2O_5$ target. Alternatively, the semiconductor layer 204 may be replaced by semiconductor ceramics, so as to implement the non-ohmic element 207, as a varistor, including the shared electrode 203, the semiconductor ceramic layer 204, and the second electrode 205.

Embodiment 2

Each of Embodiments 2 to 5 below describes a configuration to be applied to a structure suited for miniaturization. The configuration is based on the five-layer stacked structure forming the variable resistance non-volatile semiconductor memory device described in Embodiment 1.

Figure 6:
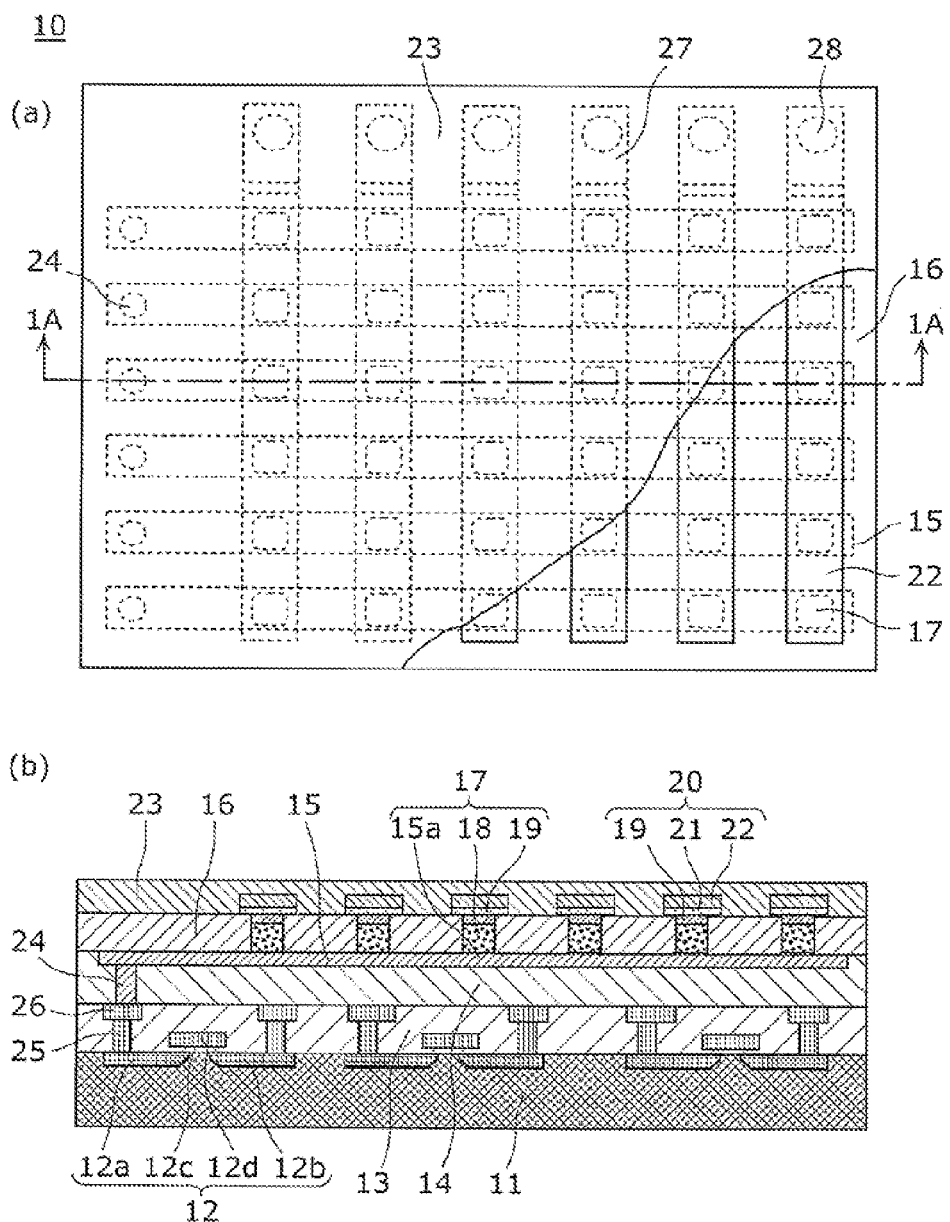
FIG. 6 is a diagram explaining a configuration of a non-volatile semiconductor memory device in Embodiment 2 according to the present invention, and (a) shows a top view whereas (b) shows a cross-section diagram viewed in the direction of arrows along a line 1A-1A shown in (a).
Figure 7:
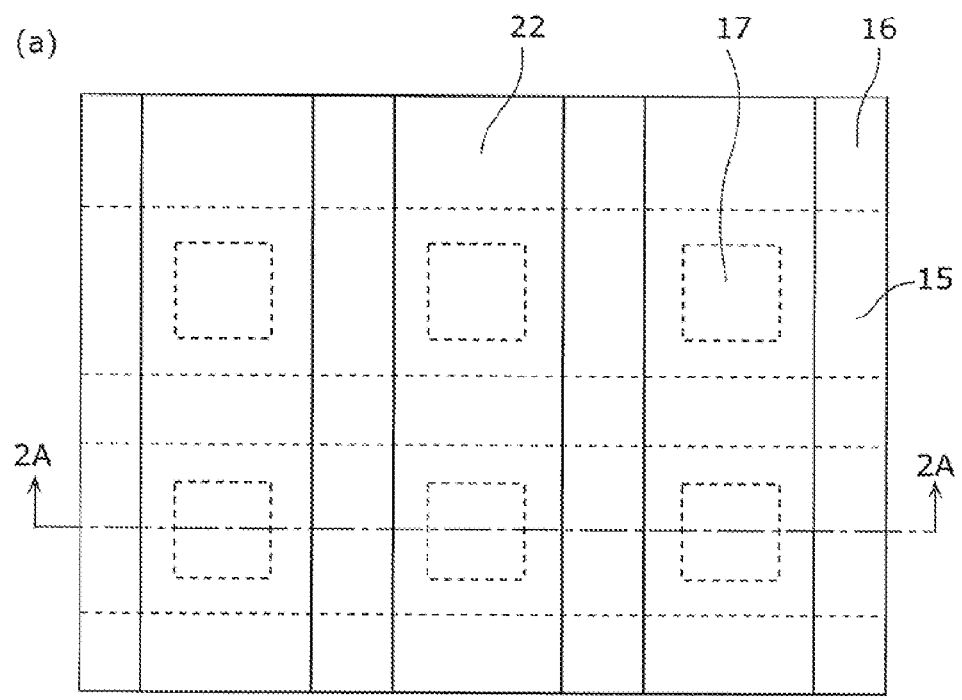
FIG. 7 is a partially enlarged view of essential parts to show configurations of a variable resistance element and a non-ohmic element of the non-volatile semiconductor memory device in Embodiment 2, and (a) shows a top view whereas (b) shows a cross-section diagram viewed in the direction of arrows along a line 2A-2A shown in (a).
Figure 7:
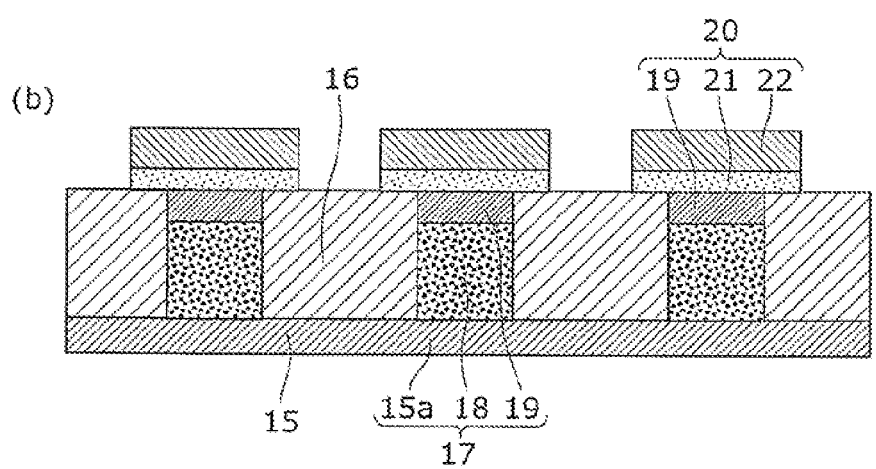

FIG. 6 is a diagram explaining a configuration of a non-volatile semiconductor memory device 10 in Embodiment 2 according to the present invention, and (a) shows a top view whereas (b) shows a cross-section diagram viewed in the direction of arrows along a line 1A-1A. It should be noted that, in the top view of (a) in FIG. 6, an insulation protection layer 23 positioned uppermost is illustrated as being partially peeled off for the sake of clarity. FIG. 7 is a partially enlarged view of essential parts to show configurations of a variable resistance element 17 and a non-ohmic element 20 shown in FIG. 6, and (a) shows a top view whereas (b) shows a cross-section diagram viewed in the direction of arrows along a line 2A-2A shown in (a).

As shown in (a) of FIG. 6, the non-volatile semiconductor memory device 10 in Embodiment 2 includes: a substrate 11; a lower electrode line 15 formed in a striped pattern on the substrate 11; an interlayer insulating layer 16 that is formed on the substrate 11 including the lower electrode line 15 and has a memory cell hole opposing the lower electrode line 15; a variable resistance layer 18 filled in the memory cell hole and connected to the lower electrode line 15; and a non-ohmic element 20 connected to the variable resistance layer 18 and formed on the variable resistance layer 18.

Here, the lower electrode line 15 formed in the striped pattern is specifically explained. As shown in (a) of FIG. 7, the lower electrode line 15 is formed to be shared by, among a plurality non-volatile semiconductor memory elements arranged in an array, a plurality of non-volatile semiconductor memory elements arranged in a first direction. Moreover, a plurality of lower electrode lines 15 are arranged in parallel, and each of the lower electrode lines 15 extends in the first direction. To be more specific, the plurality of lower electrode lines 15 are arranged in parallel extending in the first direction, on a first plane formed by a front surface of the substrate 11. It should be noted that an area, out of a region of the lower electrode line 15, that is connected to the variable resistance layer 18 is referred to as a first electrode 15a.

As shown in (b) of FIG. 6, the substrate 11 includes an active element (i.e., a transistor) 12 having a source region 12a, a drain region 12b, a gate insulating film 12c, and a gate electrode 12d. Here, the source region 12a and the drain region 12b are connected to a buried conductor 25 that is formed in the interlayer insulating layer so as to be connected to the source region 12a and the drain region 12b. Moreover, a line 26 is formed on the buried conductor 25. On the line 26, a buried conductor 24 connected to the first electrode 15a is formed. It should be noted that the substrate 11 may include not only the active element 12 but also an element usually necessary for a memory circuit such as a DRAM.

The non-volatile semiconductor memory element in Embodiment 2 includes the variable resistance element 17 and the non-ohmic element 20. The variable resistance element 17 includes the first electrode 15a, the variable resistance layer 18, and a shared electrode 19. The non-ohmic element 20 includes the shared electrode 19 formed on the variable resistance layer 18, a semiconductor layer 21, and an upper electrode 22. It should be noted that the semiconductor layer 21 included in the non-ohmic element 20 does not need to be a semiconductor layer and may be an insulator layer or a semiconductor ceramic layer (in the following, the semiconductor ceramic layer is included in the semiconductor layer). When the insulator layer is used, the non-ohmic element 20 is an MIM diode. When the semiconductor ceramic layer is used, the non-ohmic element 20 is a varistor.

Hereinafter, Embodiment 2 describes the case where the MSM diode is used as an example of the non-ohmic element 207. However, note that the non-ohmic element 207 may be an MIM diode or a varistor.

More specifically, as shown in (a) and (b) of FIG. 7, the non-ohmic element 20 is the MSM diode having a three-layer stacked structure including the shared electrode 19 comprising a metal electrode, the upper electrode 22, and the semiconductor layer 21. The shared electrode 19 is formed on a front surface of the variable resistance layer 18 in the memory cell hole. Moreover, as shown in (b) of FIG. 7, each of the other layers included in the stacked structure, namely, the semiconductor layer 21 and the upper electrode 22, has a shape (or, an area) larger than an opening of the memory cell hole and is formed on the interlayer insulating layer 16. More specifically, each of widths (i.e., lengths in diameter) of the semiconductor layer 21 and the upper electrode 22 is greater than a width of the shared electrode 19.

Moreover, in Embodiment 2, the stacked sets of the semiconductor layer 21 and the upper layer 22 are formed in a striped pattern, intersecting with the lower electrode lines 15. To be more specific, on a second plane different from the first plane where the lower electrode lines 15 are positioned, a plurality of upper electrodes 22 are arranged in parallel and each of the upper electrodes 22 extends in a second direction different from the first direction in which the lower electrode lines 15 extend. Here, the second direction intersects with the first direction in which the lower electrode lines 15 extend. For example, the second direction may be orthogonal to the first direction.

The semiconductor layer 21 is formed on the interlayer insulating layer 16. The upper electrode 22 includes a part of an upper electrode line and thus serves as a line. Then, the variable resistance layer 18, the first electrode 15a (the area, out of the region of the lower electrode line 15, that is connected to the variable resistance layer 18), and the shared electrode 19 form the variable resistance element (memory unit) 17.

For the variable resistance layer 18, it is preferable to use a tantalum oxide comprising oxygen-deficient tantalum, such as $TaO_x$ (where $0<x<2.5$), in terms of the stability in variable resistance property and the reproducibility in manufacturing, for instance. The oxygen-deficient $TaO_x$ is formed by the reactive sputtering method whereby sputtering is performed, using a tantalum target, in sputtering gas including oxygen. In this case, the oxygen content atomic percentage of the variable resistance layer 18 can be controlled by adjusting the amount of flow of oxygen in the sputtering gas.

Moreover, the three-layer stacked structure including the shared electrode 19, the semiconductor layer 21, and the upper electrode 22 form the MSM diode which is the non-ohmic element 20.

As shown in (a) and (b) of FIG. 6, the semiconductor or insulator layer 21 and the upper electrode 22 are formed, extending beyond a region where the variable resistance element 17 and the non-ohmic element 20 are formed in a matrix. Then, the upper electrode 22 is connected to an upper layer line 27 via a buried conductor 28 outside this matrix region.

As described above, the upper electrodes 22, i.e., the second electrodes, are formed in the striped pattern. To be more specific, the plurality of upper electrodes 22 are arranged in parallel, and each of the upper electrodes 22 extends in the second direction intersecting with the first direction in which the lower electrode lines 15 extend.

Furthermore, each of the lower electrode line 15 and the upper layer line 27 is connected to the active element 12 in a region different from the matrix region where the variable resistance element 17 and the non-ohmic element 20 are formed. More specifically, in (b) of FIG. 6, the lower electrode line 15 is connected to the source region 12a of the active element 12 via the buried conductors 24 and 25 and the line 26. Similarly, the upper layer line 27 is connected to another active element (not shown) via the buried conductor 28. It should be noted that, as described later, the upper layer line 27 serves as a word line whereas the lower electrode line 15 serves as a bit line in the non-volatile semiconductor memory device 10.

Next, each of materials included in the layers is explained.

The lower electrode line 15 is formed as follows: a film is formed by sputtering using, for example, a Ti—Al—N alloy, Cu, or Al as a wiring material; a film comprising a precious metal as an electrode material, such as Pt, Ir, or Pd, is formed on a front side of the aforementioned film; and then a photolithography process and an etching process are performed. These electrode materials may include a different material as long as the high standard electrode potentials of these electrode materials are not compromised (that is, as long as the standard electrode potential higher than that of the transition metal included in the variable resistance layer can be maintained).

The variable resistance layer 18 of the variable resistance element 17 may be formed by the sputtering method or the like using, instead of the above-mentioned oxygen-deficient tantalum oxide, a transition metal oxide material, such as an oxygen-deficient hafnium oxide, a titanium oxide, a vanadium oxide, a cobalt oxide, a nickel oxide, a zinc oxide, a niobium oxide, or a tungsten oxide. Such a transition metal oxide material shows a specific resistance value in response to the application of a voltage or a current greater than or equal to a threshold, and maintains this resistance value until a new pulse voltage or a new pulse current at a certain level is applied.

Moreover, for the interlayer insulating layer 16, an insulating oxide material can be used. To be more specific, the following can be used: a silicon oxide (SiO) formed by a chemical vapor deposition (CVD) method; a TEOS-SiO film formed by the CVD method using ozone ($O_3$) and tetraethoxysilane (TEOS); or a silicon nitride (SiN) film. Alternatively, the following low-permittivity material may be used: a silicon carbonitride (SiCN) film; a carbon-doped silicon oxide (SiOC); or a fluorine-doped silicon oxide film (SiOF).

Furthermore, for the upper electrode 22 included in the non-ohmic element 20, the following may be used, for example: tantalum nitride (TaN); titanium nitride (TiN); or tungsten ($\alpha$-W) having a body-centered cubic lattice (bcc) structure. For the semiconductor layer 21, a nitrogen-deficient silicon nitride ($SiN_z$ where $0<z\leq0.85$) can be used. With this configuration, the MSM diode having the stacked structure including the shared electrode 19, the semiconductor layer 21, and the upper electrode 22 may be used. Here, Al, Cu, or the like can be used for an electrode. By using these materials, a wiring resistance can be reduced. However, in this case, attention is necessary since a leakage may occur to the non-ohmic element due to, for example, a thermal process.

It is preferable for the shared electrode 19 to comprise a metal nitride that is formed by nitriding the variable resistance layer 18. The metal nitride formed by nitriding the variable resistance layer 18 may include oxygen. For example, in Embodiment 2, it is preferable to use, for the shared electrode 19, a tantalum nitride included in the variable resistance layer 18. Moreover, a nitride of the transition metal included in the variable resistance layer 18 may be any material as long as the material has electrical conductivity and also has a work function higher than the electron affinity of a semiconductive material included in the semiconductor layer 21. When the insulator layer 21 is used instead of the semiconductor layer 21, it is preferable to use, for example, tantalum pentoxide ($Ta_2O_5$), alumina ($Al_2O_3$), or Mania ($TiO_2$). As a semiconductor ceramic material included in the varistor, the following can be used as an example: zinc oxide (ZnO); strontium titanate (SrTiO$_3$); or silicon carbide (SiC).

Figure 8:
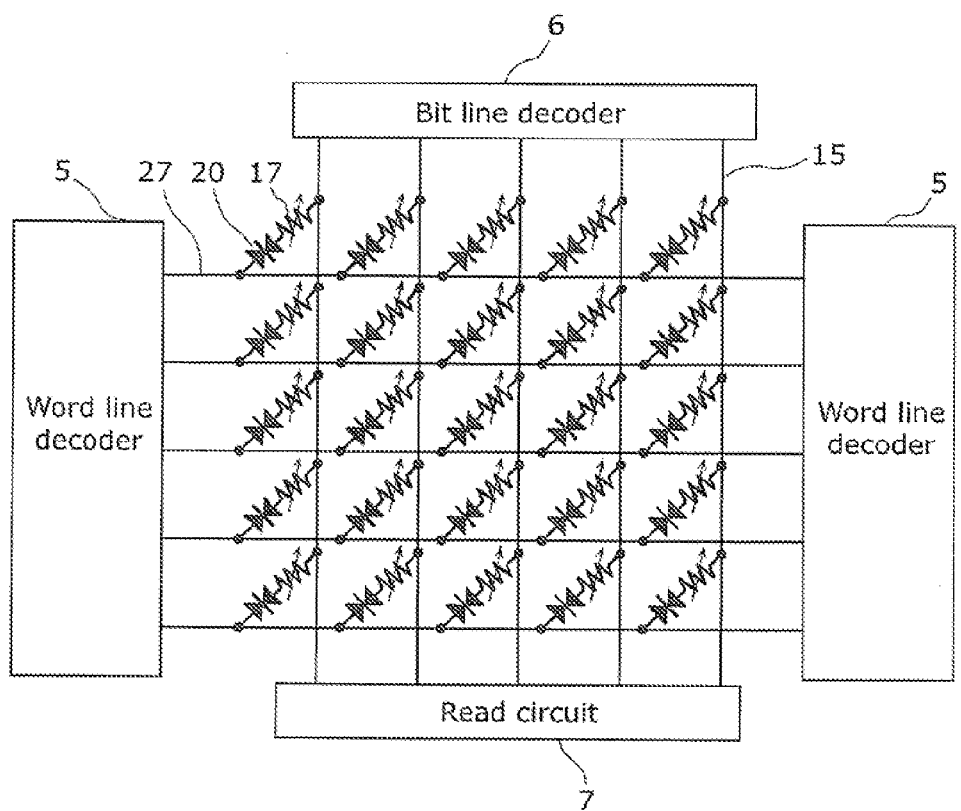
FIG. 8 is a block diagram showing a schematic circuit configuration of the non-volatile semiconductor memory device in Embodiment 2.

FIG. 8 is a block diagram showing a schematic circuit configuration (including a memory cell array and a driver circuit) of the non-volatile semiconductor memory device 10 in Embodiment 2 according to the present invention. As shown in FIG. 8, the variable resistance element 17 and the non-ohmic element 20 are connected in series. Moreover, one of ends of the variable resistance element 17 is connected to the lower electrode line 15, and one of ends of the non-ohmic element 20 is connected to the upper layer line 27. The lower electrode line 15 is connected to a bit line decoder 6 and a read circuit 7. The upper layer line 27 is connected to a word line decoder 5. In this way, the lower electrode line 15 configured as a bit line and the upper layer line 27 configured as a word line are arranged in a matrix.

Moreover, as shown in FIG. 8, each of the bit line decoder 6, the word line decoder 5, and the read circuit 7 is configured as a peripheral circuit. Each of these peripheral circuits is configured with the active element 12 including a MOSFET. Here, the bit line decoder 6 and the word line decoder 5 may include a bit line driver circuit and a word line driver circuit, respectively.

Next, a method of manufacturing the non-volatile semiconductor memory device 10 in Embodiment 2 is described, with reference to FIGS. 9 to 12. Each of FIGS. 9 to 12 is a diagram showing a process of manufacturing the non-volatile semiconductor memory device 10 in Embodiment 2.

Figure 9:
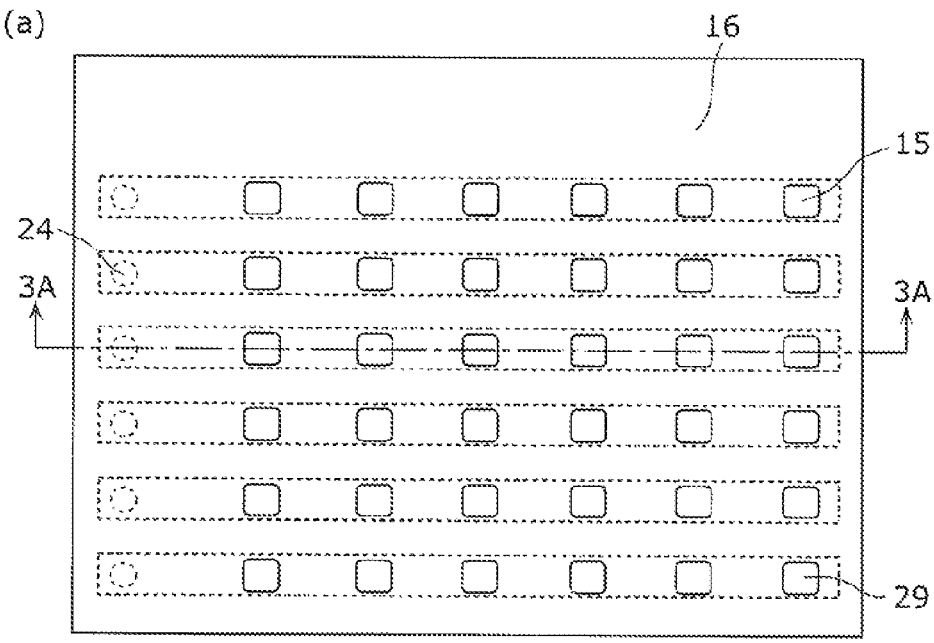
FIG. 9 is a diagram showing a process of manufacturing the non-volatile semiconductor memory device in Embodiment 2, and (a) shows a top view where the memory cell hole is formed, (b) shows a cross-section diagram where an interlayer insulating layer is formed, and (c) shows a cross-section diagram viewed in the direction of arrows along a line 3A-3A shown in (a).
Figure 9:
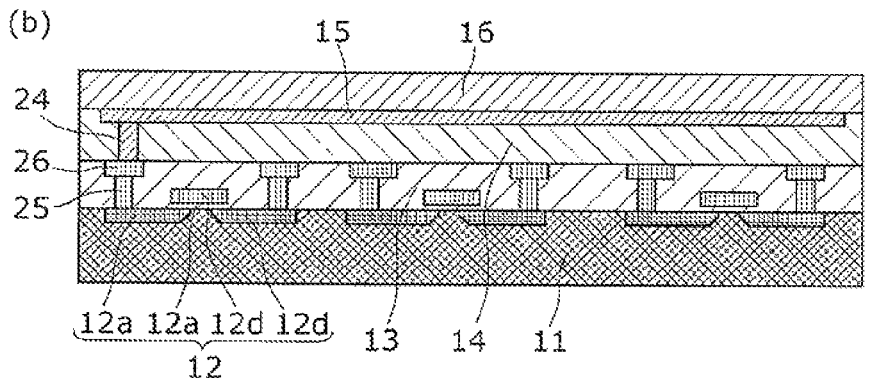
Figure 9:
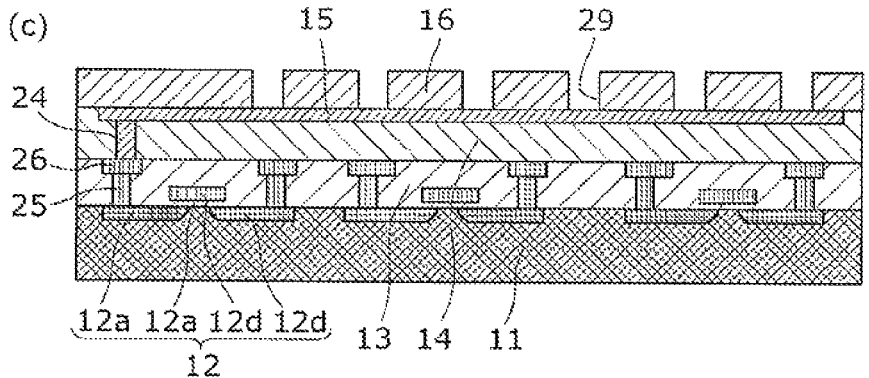

FIG. 9 is a diagram showing a process where: layers up to the interlayer insulating layer 16 are formed on the substrate 11 on which the active element is formed; and a memory cell hole 29 is formed in the interlayer insulating layer 16. More specifically, in FIG. 9, (a) shows a top view where the memory cell hole 29 is formed. In FIG. 9, (b) shows a cross-section diagram where the interlayer insulating layer 16 is formed and the memory cell hole 29 has yet to be formed, the diagram being viewed in the direction of arrows along a line 3A-3A shown in (a). Moreover, (c) in FIG. 9 is a cross-section diagram viewed in the direction of the arrows along the line 3A-3A shown in (a).

Figure 10:
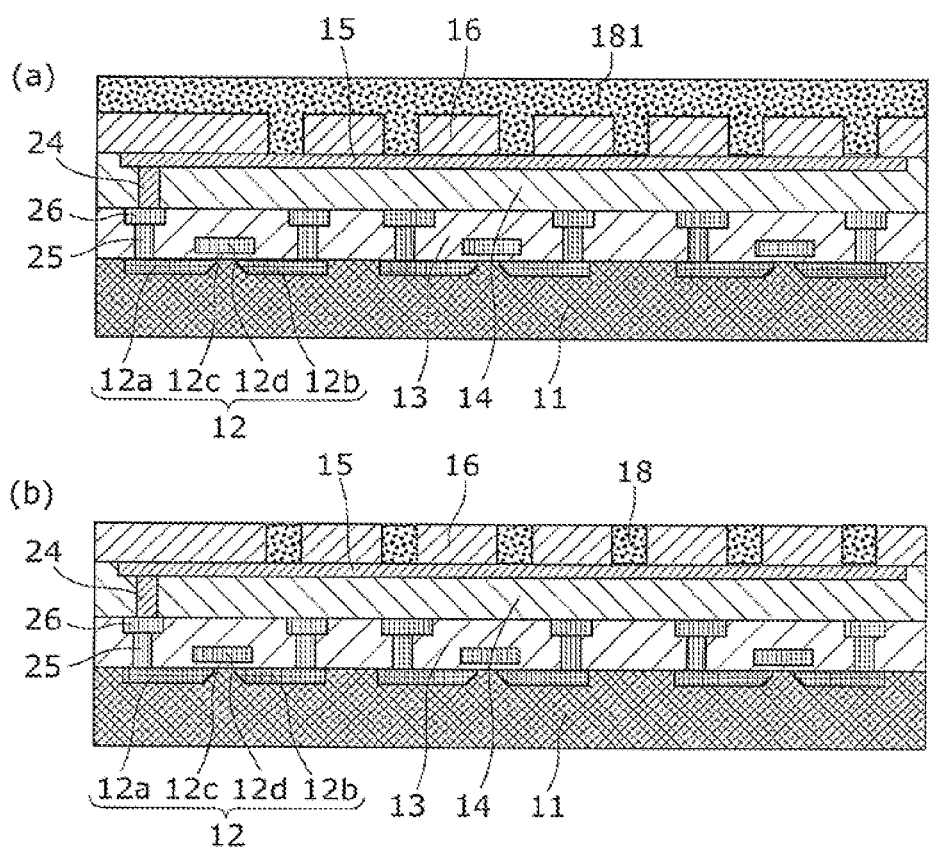
FIG. 10 is a diagram showing a process of manufacturing the non-volatile semiconductor memory device in Embodiment 2, and (a) shows a cross-section diagram where a resistance film layer that is to be a variable resistance layer is formed whereas (b) shows a cross-section diagram where the resistance film layer on the interlayer insulating layer is eliminated by the CMP process.

FIG. 10 is a diagram showing a process of filling the variable resistance layer 18 and the shared electrode 19 into the memory cell hole 29 after the process shown in (c) of FIG. 9 is performed. More specifically, in FIG. 10, (a) shows a cross-section diagram where a resistance film layer 181 that is to be the variable resistance layer is formed, the diagram being viewed in the direction of the arrows along the line 3A-3A shown in (a) of FIG. 9. Moreover, (b) in FIG. 10 shows a cross-section diagram where the resistance film layer 181 on the interlayer insulating layer 16 is eliminated by the CMP process, the diagram being viewed in the direction of the arrows along the line 3A-3A shown in (a) of FIG. 9.

Figure 11:
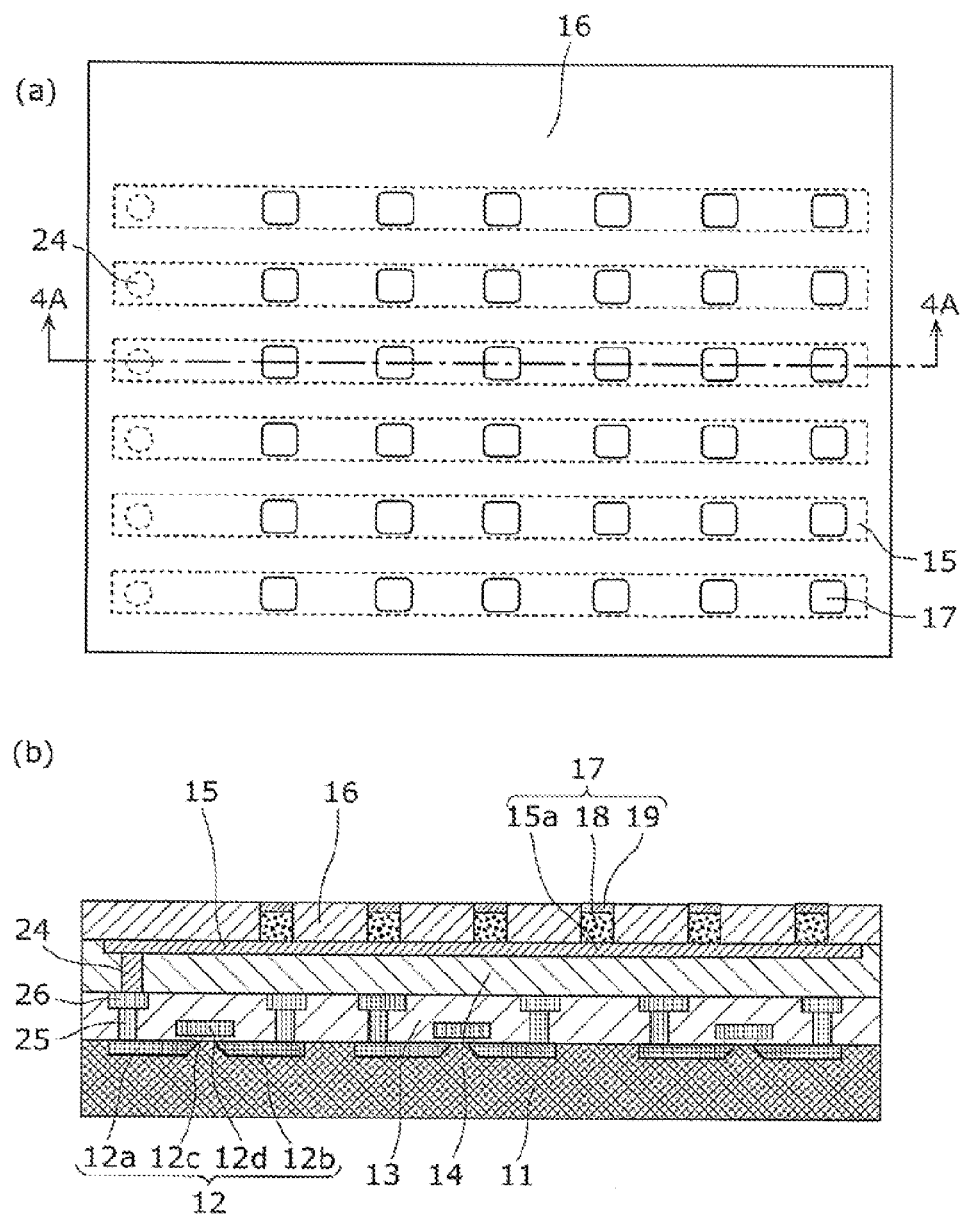
FIG. 11 is a diagram showing a process of manufacturing the non-volatile semiconductor memory device in Embodiment 2, and (a) shows a top view whereas (b) shows a cross-section diagram viewed in the direction of arrows along a line 4A-4A shown in (a).

FIG. 11 is a diagram showing that the shared electrode 19 is formed in the memory cell hole 29 by nitriding the exposed front surface of the variable resistance layer 18. More specifically, in FIG. 11, (a) shows a top view whereas (b) shows a cross-section diagram viewed in the direction of arrows along a line 4A-4A shown in (a).

Figure 12:
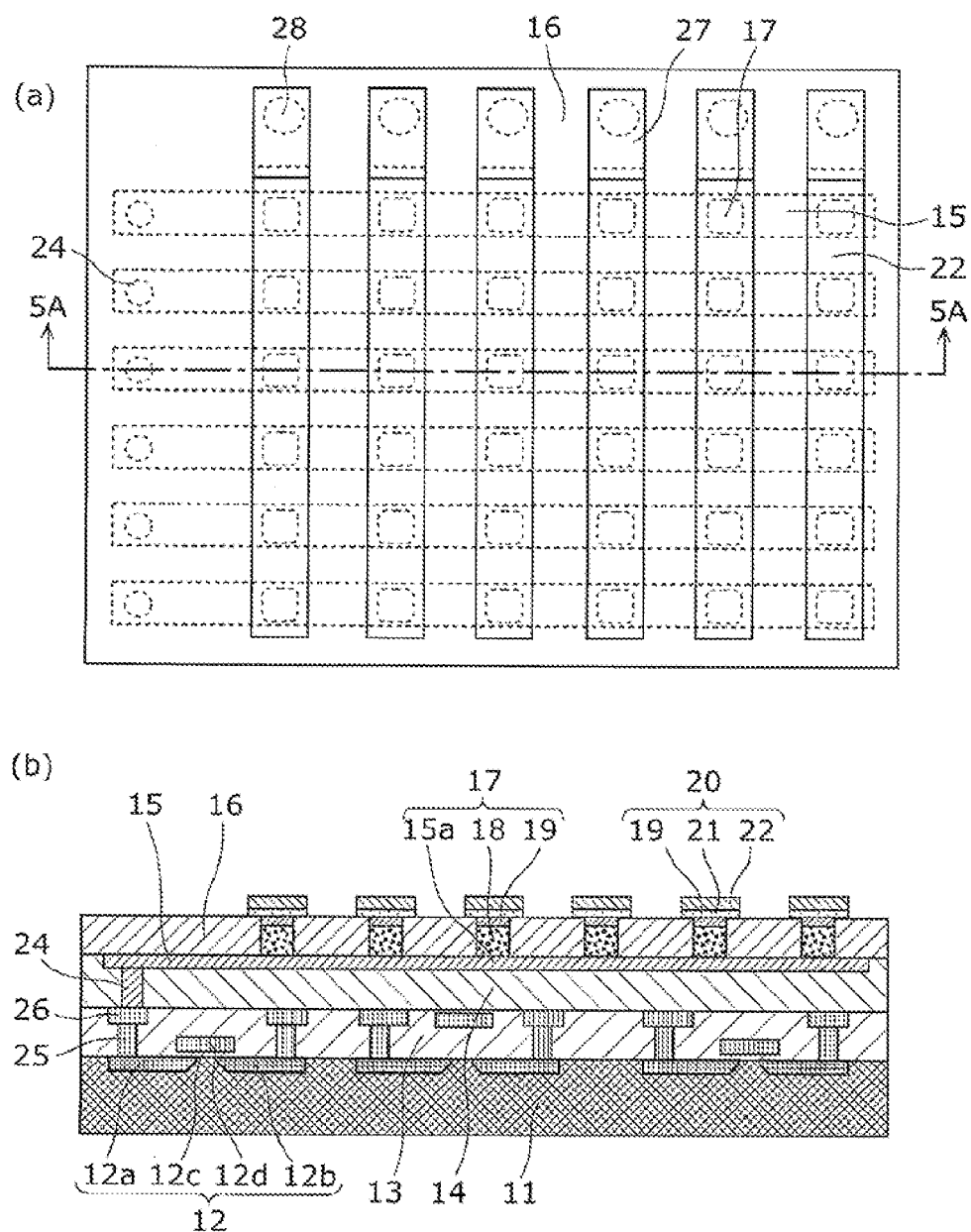
FIG. 12 is a diagram showing a process of manufacturing the non-volatile semiconductor memory device in Embodiment 2, and (a) shows a top view whereas (b) shows a cross-section diagram viewed in the direction of arrows along a line 5A-5A shown in (a).

FIG. 12 is a diagram showing that, after the process shown in (b) of FIG. 11 is performed, the semiconductor layer 21 and the upper electrode 22 are formed and the upper layer line 27 is formed. More specifically, in FIG. 12, (a) shows a top view whereas (b) shows a cross-section diagram viewed in the direction of arrows along a line 5A-5A shown in (a).

The following describes the method of manufacturing the non-volatile semiconductor memory device 10 in Embodiment 2, with reference to FIGS. 9 to 12.

As shown in (a) and (b) of FIG. 9, the lower electrode line 15 and the interlayer insulating layer 16 are formed on the substrate 11 on which a plurality of active elements 12, the line 26, and the interlayer insulating layers 13 and 14 are formed. Conventionally, aluminium is mainly used for the line 26. However, in recent years, copper that is capable of implementing low resistance even in a finer design is mainly used. Moreover, the following is used for the interlayer insulating layers 13 and 14: a fluorine-containing oxide (such as SiOF) in order to reduce a parasitic capacity between lines; a carbon-containing nitride (such as SiCN); or an organic resin material (such as polyimide). In Embodiment 2, copper can be used for the line 26 as an example, and SiOF that is a fluorine-containing oxide can be used for the interlayer insulating layers 13 and 14.

The lower electrode line 15 is filled into the interlayer insulating layer 14. To be more specific, a plurality of trenches are formed in order for the lower electrode lines 15 to be arranged in parallel in the interlayer insulating layer 14. Moreover, a contact hole is formed for the buried conductor 24 that connects the lower electrode line 15 to the line 26. These trenches and holes can be easily formed by a technique employed in a common semiconductor process.

After forming these trenches and contact holes, a conductor film that is to be the lower electrode line 15 is formed on the entire surface. Next, by performing, for example, the CMP process (a damascene method), the lower electrode line 15 having a shape as shown in (a) and (b) of FIG. 9 can be formed.

It is preferable for the precious metal material, such as Pt or Ir, that functions as an electrode to be formed on the front surface of the lower electrode line 15. However, any metal can be used as long as the metal has a higher standard electrode potential than the transition metal included in the variable resistance layer.

For forming a different metal on the front surface of the lower electrode line 15, the metal may be formed by, for example, electroless plating selectively performed on a part or whole of the front surface of the lower electrode line 15. Alternatively, a recess (a concave part) is formed on the front surface of the lower electrode line 15 by the aforementioned CMP process of the damascene method, the film of the different metal is formed on the entire surface, and then, by further performing the CMP process, the film of the different metal can be formed on the front surface of the lower electrode line 15. It should be noted that, instead of the Ti—Al—N alloy described above, Cu, Al, or Ti—Al alloy or a stacked structure of these metals may be used for the lower electrode line 15.

As shown in (b) in FIG. 9, the interlayer insulating layer 16 comprising TEOS-SiO is formed on the substrate 11 including this lower electrode line 15, by using the CVD method. It should be noted that the various kinds of materials can be used for this interlayer insulating layer 16 as described above.

Moreover, as shown in (c) of FIG. 9, the memory cell holes 29 are formed, with constant array pitches, in the interlayer insulating layer 16 formed on the lower electrode line 15. The memory cell hole 29 has an inside diameter smaller than a width of the lower electrode line 15. In (a) of FIG. 9, the memory cell hole 29 is square in shape. However, note that the memory cell hole 29 may be circular, oval, or in a different shape. The memory cell hole 29 as described can be formed by a common semiconductor process and, therefore, a detailed explanation is omitted here.

Next, as shown in (a) of FIG. 10, the resistance film layer 181 (a first deposited film) that is to be the variable resistance layer 18 is formed on the interlayer insulating layer 16 including the memory cell holes 29. In Embodiment 2, the resistance film layer 181 is formed by depositing a tantalum oxide (TaO$_x$ where 0<x<2.5) that is the same material included in the variable resistance layer 18, into the memory cell hole 29 and onto the interlayer insulating layer 16 according to the reactive sputtering method. Such a TaO$_x$ film may be formed in an oxygen gas atmosphere using a Ta target at ambient temperature, with a chamber pressure being 0.03 Pa to 3 Pa and a flow rate of Ar/O$_2$ being 20/5 sccm to 20/30 sccm, for example. The method of forming the film is not limited to the sputtering method, and the CVD method or the atomic layer deposition (ALD) method may be used.

Then, as shown in (b) of FIG. 10, only the resistance film layer 181 covering the front surface of the interlayer insulating layer 16 is eliminated by the CMP process, so that the variable resistance layer 18 is filled in the memory cell hole 29.

After this, as shown in (a) and (b) of FIG. 11, the front surface part of the variable resistance layer 18 filled in the memory cell hole 29 is nitrided by the plasma nitriding process. As a result, the shared electrode 19 comprising the tantalum nitride is formed. Here, the plasma nitriding process is performed on the wafer maintained at 300 degrees centigrade to 400 degrees centigrade under conditions that: the flow rate of N$_2$ is 0.5 slm; the RF power is 200 W to 400 W; and the degree of vacuum is 30 Pa.

In order to compare the method of forming the shared electrode 19 in Embodiment 2 with the conventional method of forming a shared electrode, the following describes the conventional method of forming the shared electrode.

According to the conventional method of manufacturing the non-volatile semiconductor memory device, the shared electrode is formed as follows. First, a part of the variable resistance layer formed in the memory cell hole is eliminated by overpolishing according to the CMP process or the dry or wet etching method, and a concave part is formed in the memory cell hole and the variable resistance layer (i.e., the remaining part of the first deposited film). Next, an electrode film layer (a second deposited film) that is to be the shared electrode is formed on the interlayer insulating layer including the memory cell hole (the concave part). Then, only the electrode film layer covering the front surface of the interlayer insulating layer is eliminated by the CMP process, so that the shared electrode is filled in the memory cell hole.

In order to form the shared electrode 19, the conventional method requires three steps which are: the CMP process and the overpolishing; the formation of the electrode film layer; and the CMP process. In Embodiment 2, on the other hand, these three steps can be replaced by one step of the nitriding process. On this account, Embodiment 2 is superior in that the manufacturing method can be simplified. Moreover, the overpolishing performed according to the conventional manufacturing method may cause erosion to the interlayer insulating layer located around the memory cell hole. This may lead to variations in electrical characteristics. However, according to the aforementioned method of forming the shared electrode by the plasma nitriding process, after the variable resistance layer 18 is formed by the filling process, a part of the upper surface of the variable resistance layer 18 is nitrided by the plasma nitriding process to form the shared electrode 19. Thus, the shared electrode 19 can have a smooth front surface. When the semiconductor layer 21 is formed on such a smooth surface of the shared electrode 19 and the thickness of the semiconductor layer 21 is reduced, stacked films having favorable smoothness can be obtained. Moreover, the thickness of the shared electrode 19 to be formed can be controlled by the wafer heating temperature and the plasma power and, therefore, the thickness of the shared electrode 19 can be controlled accurately. Hence, even when the semiconductor layer 21 is thinly formed on the shared electrode 19, the resistance to pressure can be appropriately ensured for the semiconductor layer 21. Furthermore, the surface smoothness can be maintained after the shared electrode 19 is formed, thereby reducing variations in electrical characteristics of the present non-volatile semiconductor memory element. In particular, by using the plasma nitriding process as a nitriding process, a plasma state can be uniformly controlled by, for example, an external magnetic field effect. Thus, variations in film thickness of the shared electrode 19 can be reduced, thereby reducing in-plane variations in characteristics of the non-volatile semiconductor memory element.

Next, the following explains a process of forming the semiconductor layer 21 and the upper electrode 22 of the non-ohmic element 20 after the shared electrode 19 is formed. As shown in (a) and (b) of FIG. 12, the semiconductor layer 21 and the upper electrode 22 are stacked so as to be connected to the shared electrode 19. In this case, the semiconductor layer 21 and the upper electrode 22 are formed on the interlayer insulating layer 16, covering the opening of the memory cell hole 29 by a shape (or, an area) larger than at least the opening of the memory cell hole 29. Moreover, in the direction intersecting with the lower electrode line 15 (in (a) of FIG. 12, the direction intersecting at an angle of 90 degrees with the direction in which the lower electrode line 15 extends), the plurality of upper electrodes 22 are formed in parallel, that is, formed in a striped pattern. In Embodiment 2, suppose that aluminium (Al) or copper (Cu) is used for the upper electrode 22 and SiN$_z$ (where 0<z≦0.85) is used for the semiconductor layer 21. In this case, by forming SiN$_z$ according to the reactive sputtering method using a silicon target in sputtering gas including nitrogen, a thin film having a favorable semiconducting property can be formed with a high degree of definition. It should be obvious that a SiN$_z$ target having a predetermined nitrogen concentration may be prepared in advance and the film is formed by the sputtering method.

In this way, since the upper surface of the shared electrode 19 is entirely covered with the semiconductor layer 21, there is no leakage that may be caused in an outer region of the semiconductor layer 21 when the shared electrode 19 comes in contact with the upper electrode 22. Moreover, since the width of the upper electrode 22 is wider than that of the shared electrode 19, a path for electrical current to flow to the non-ohmic element 20 is formed wider than an area of the upper surface of the shared electrode 19. In this case, an electric line of force by the electric field extends from the shared electrode 19 in the memory cell hole 29 to the semiconductor layer 21. Thus, an effective area of the non-ohmic element 20 (i.e., the MSM diode) is larger than that of the conventional diode where all the layers are filled in the memory cell hole. On account of this, the non-ohmic element 20 can be obtained that is configured with the MSM diode having a larger current capacity and fewer variations in characteristics as compared with the conventional diode.

Moreover, as shown in (a) of FIG. 12, the upper layer line 27 is formed (not illustrated in (b) of FIG. 12) so as to be connected to the upper electrode 22 outside the region where the variable resistance elements 17 and the non-ohmic elements 20 (the MSM diode) are formed in a matrix. Here, the same material that is used for the lower electrode line 15 can be used for the upper layer line 27 as well. The upper layer line 27 and the buried conductor 28 are formed at the same time. Then, via this buried conductor 28, the upper layer line 27 is connected to the line 26 provided in the interlayer insulating layer 13 and electrically connected to the active element. It should be noted that, when the upper electrodes 22 are formed in the striped pattern as described above, the upper electrode 22 also serves as the upper layer line 27 and, therefore, the upper layer line 27 can be omitted in such a case.

After this, as shown in (a) and (b) of FIG. 6, the insulation protection layer 23 covering the upper electrode 22 and the upper layer line 27 is formed. To be more specific, the insulation protection layer 23 is formed on an area, out of a region of the interlayer insulating layer 16, where the semiconductor layer 21 and the upper electrode 22 are not formed. As a result, the non-volatile semiconductor memory device 10 as shown in this diagram can be manufactured.

According to Embodiment 2, since the shared electrode 19 can be formed by being filled in the memory cell hole, the manufacturing process such as the CMP process can be simplified. Also, the interfacial surface between the shared electrode 19 and the semiconductor layer 21 can be formed flat. Therefore, in addition to the great advantageous effects in Embodiment 1, the current capacity can be increased and the characteristics of the non-ohmic element 20 can be stabilized. Moreover, the shared electrode 19 having a high nitrogen density can be formed at a low temperature by the plasma nitriding process employed as a nitriding process. Thus, the shared electrode 19 can be significantly thinned, and is useful for miniaturization. Moreover, the plasma nitriding process can uniformly control a plasma state by, for example, an external magnetic field effect. Thus, variations in film thickness of the shared electrodes can be reduced, thereby reducing in-plane variations in characteristics of the non-volatile memory element.

Embodiment 2 has described the case where the MSM diode employing $SiN_z$ (where $0<z\leq0.85$) is used as the semiconductor layer 21. However, it should be noted that the present invention is not limited to this. For example, tantalum pentoxide ($Ta_2O_5$), alumina ($Al_2O_3$), or titania ($TiO_2$) that is an insulator may be used as an insulator layer. When $Ta_2O_5$ is used, any film-forming method may be employed. Examples of the method include: a method of forming a film according to the CVD method; and a method of directly forming a $Ta_2O_5$ film by sputtering using a $Ta_2O_5$ target. Alternatively, the semiconductor layer 21 may be replaced by semiconductor ceramics, so as to implement the non-ohmic element 207, as a varistor, including the shared electrode 203, the semiconductor ceramic layer 204, and the second electrode 205.

[Modification of Embodiment 2]

Figure 13:
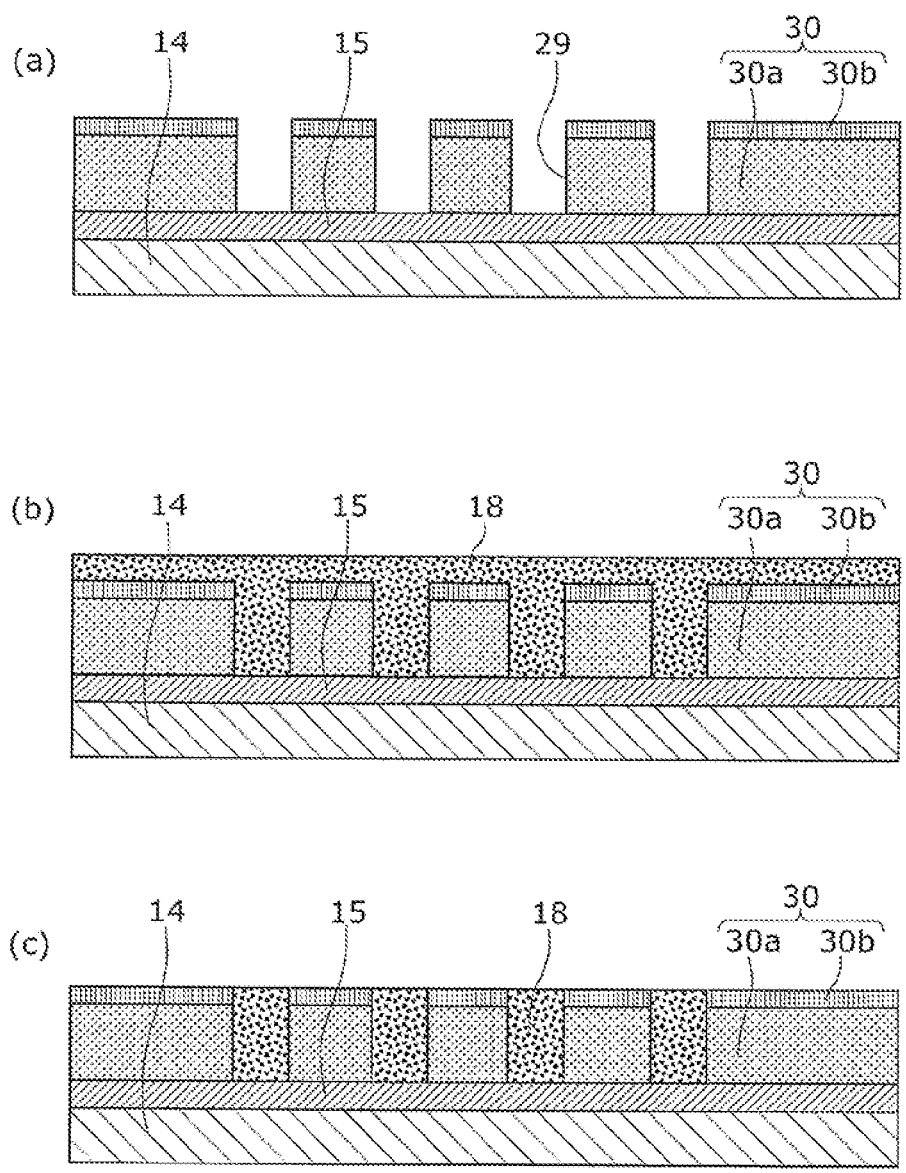
FIG. 13 is a diagram showing a process of manufacturing a non-volatile semiconductor memory device in Modification of Embodiment 2, and (a) shows a cross-section diagram where a memory cell hole is formed, (b) shows a cross-section diagram where a resistance film layer that is to be a variable resistance layer is formed, and (c) shows a cross-section diagram where the resistance film layer on the interlayer insulating layer is eliminated by the CMP process.
Figure 14:
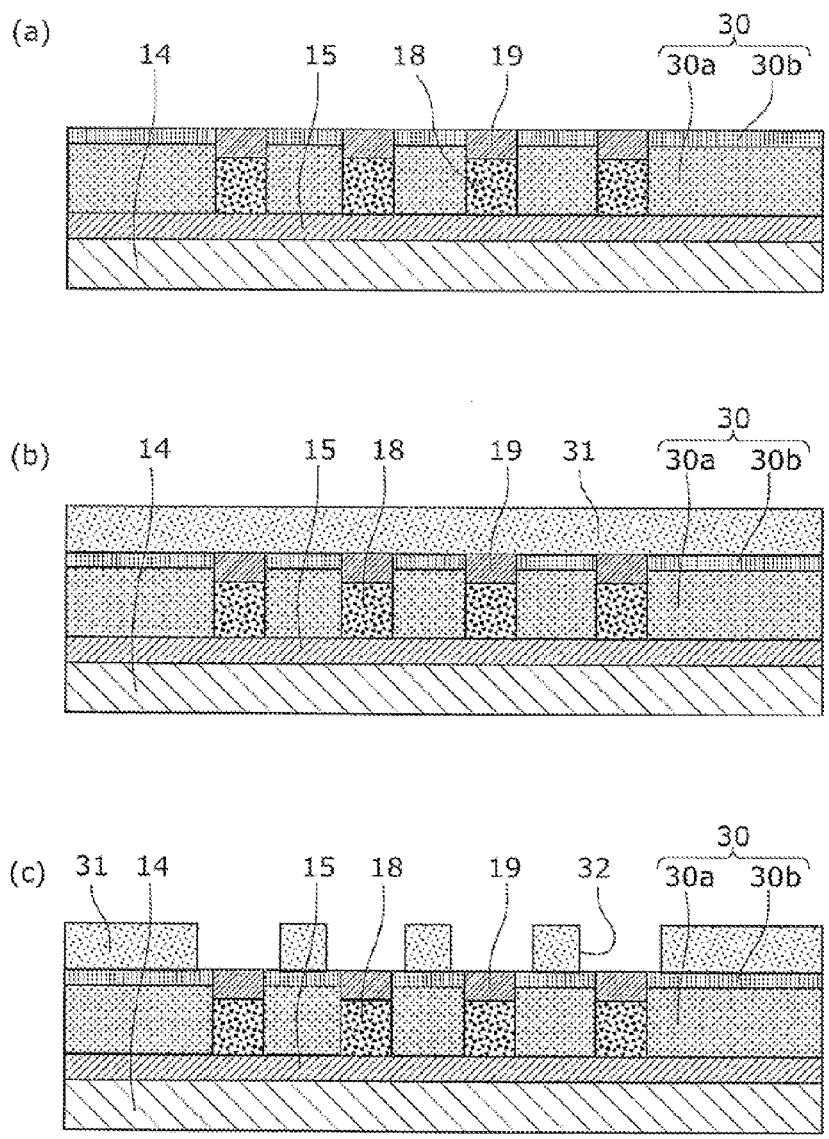
FIG. 14 is a diagram showing a process of manufacturing a non-volatile semiconductor memory device in Modification of Embodiment 2, and (a) shows a cross-section diagram where a shared electrode 19 is formed on a variable resistance layer 18 by the plasma nitriding process, (b) shows a cross-section diagram where an interlayer insulating layer is formed, and (c) shows a cross-section diagram where a trench is formed in this interlayer insulating layer.
Figure 15:
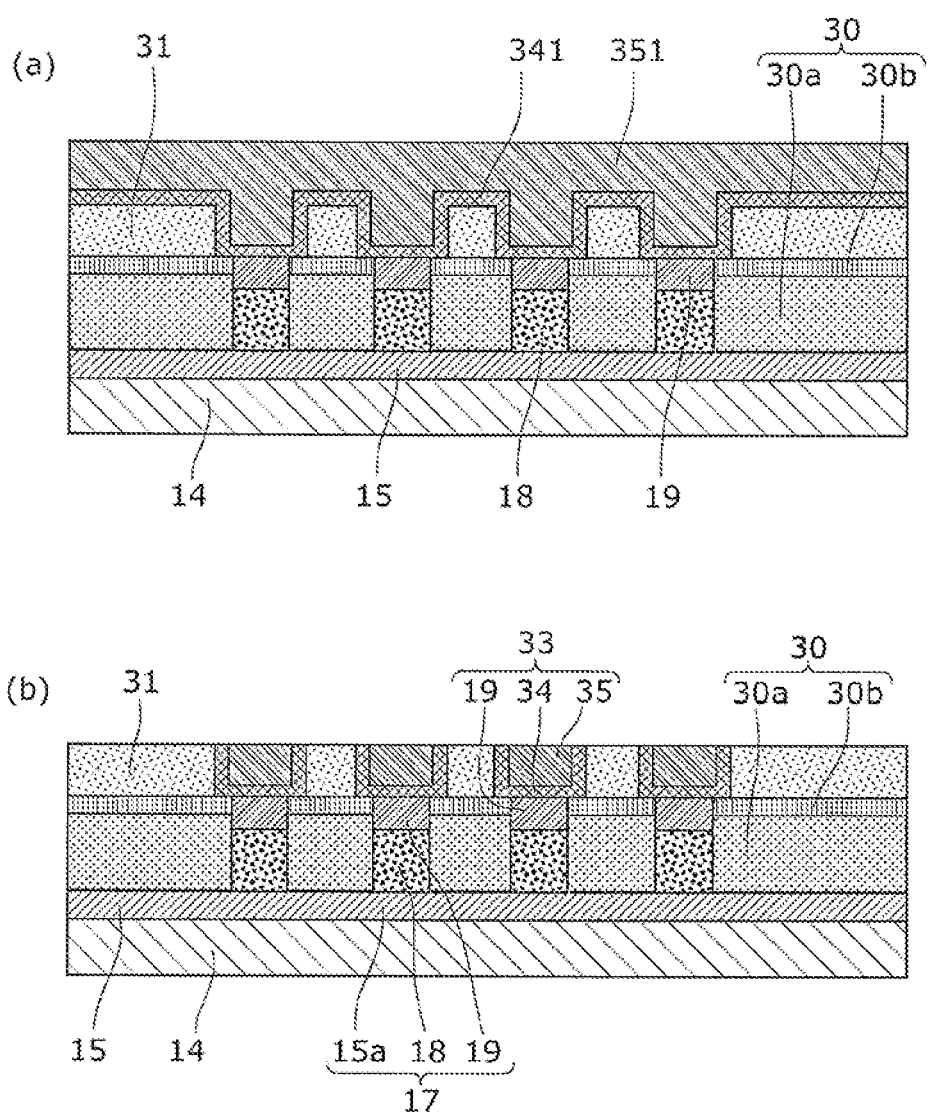
FIG. 15 is a diagram showing a method of manufacturing a non-volatile semiconductor memory device in Modification of Embodiment 2 and also showing a process of filling an insulator layer and an upper electrode into the trench, and (a) shows a cross-section diagram where an insulator film layer that is to be the insulator layer and an electrode film layer that is to be the upper electrode are formed on an interlayer insulating layer including the trench whereas (b) shows a cross-section diagram where the electrode film layer and the insulator film layer formed on the interlayer insulating layer are eliminated by the CMP process so that the insulator layer and the upper electrode are filled in the trench.

The following describes a manufacturing method in Modification of Embodiment 2, with reference to FIGS. 13 to 15. It should be noted that, in each of FIGS. 13 to 15, only an upper configuration from the interlayer insulating layer 14 is shown for the sake of simplifying the illustration.

Each of FIGS. 13 to 15 is a diagram showing a process of manufacturing a non-volatile semiconductor memory device 10 in Modification of Embodiment 2. FIG. 13 is a diagram showing a process of filling the variable resistance layer 18 into the memory cell hole 29 provided in an interlayer insulating layer 30. More specifically, in FIG. 13, (a) shows a cross-section diagram where the memory cell hole 29 is formed, (b) shows a cross-section diagram where the resistance film layer 181 that is to be the variable resistance layer 18 is formed, and (c) shows a cross-section diagram where the resistance film layer 181 formed on the interlayer insulating layer 30 is eliminated by the CMP process. FIG. 14 is a diagram showing a process performed after the process shown in (c) of FIG. 13. That is, the process shown in FIG. 14 is performed for: forming the shared electrode 19 by selectively nitriding the upper surface of the variable resistance layer 18 in the memory cell hole 29; forming an interlayer insulting layer 31; and forming a trench 32 in order for the upper surface of the shared electrode 19 to be exposed. More specifically, in FIG. 14, (a) shows a diagram where the shared electrode 19 is formed on the front surface of the variable resistance layer 18 by the plasma nitriding process, (b) shows a cross-section diagram where the interlayer insulating layer 31 is formed, and (c) shows a cross-section diagram where the trench 32 is formed in this interlayer insulating layer 31. FIG. 15 is a diagram showing a process performed after the process shown in (c) of FIG. 14, for filling a semiconductor layer 34 and an upper electrode 35 into the trench 32. More specifically, in FIG. 15, (a) shows a cross-section diagram where a semiconductor film layer 341 that is to be the semiconductor layer 34 and an electrode film layer 351 that is to be the upper electrode 35 are formed on the interlayer insulating layer 31 including the trench 32. In FIG. 15, (b) shows a cross-section diagram where the electrode film layer 351 and the semiconductor film layer 341 formed on the interlayer insulating layer 31 are eliminated by the CMP process so that the semiconductor layer 34 and the upper electrode 35 are filled in the trench 32.

Firstly, as shown in (a) of FIG. 13, on the interlayer insulating layer 14 having the lower electrode 15 on the front surface thereof, a first insulating layer 30a and a second insulating layer 30b are sequentially formed using the CVD method. Here, the first insulating layer 30a comprises TEOS-SiO, and the second insulating layer 30b comprises a material, such as SiON, that is harder than TEOS-SiO. The first insulating layer 30a and the second insulating layer 30b form the interlayer insulating layer 30. The second insulating layer 30b serves as a stopper in the CMP process. In other words, the second insulating layer 30b allows the CMP process to be performed easily and reliably. Moreover, after this, the memory cell hole 29 is formed in the interlayer insulating layer 30 formed on the lower electrode line 15. The memory cell hole 29 has an inside diameter smaller than a width of the lower electrode line 15. Here, the manufacturing process and the shape of the memory cell hole 29 are the same as explained with reference to FIGS. 9 to 12.

Next, as shown in (b) of FIG. 13, the resistance film layer 181 (the first deposited film) that is to be the variable resistance layer 18 is formed on the interlayer insulating layer 30 including the memory cell holes 29. As in Embodiment 2, the variable resistance layer 18 (the resistance film layer 181) is formed by depositing an oxygen-deficient tantalum oxide ($TaO_x$ where $0<x<2.5$) according to the reactive sputtering method. The method of forming the film is not limited to the sputtering method, and the CVD method or the ALD method may be used.

Then, as shown in (c) of FIG. 13, the resistance film layer 181 formed on the interlayer insulating layer 30 is eliminated by the CMP process, so that the variable resistance layer 18 is filled in the memory cell hole 29. Here, the second insulating layer 30b is provided in the interlayer insulating layer 30. Thus, since the second insulating layer 30b servers as the stopper, only the resistance film layer 181 can be reliably eliminated while the interlayer insulating layer 30 is hardly polished.

After this, as shown in (a) of FIG. 14, oxygen atoms in the front surface of the variable resistance layer 18 filled in the memory cell hole 29 are replaced by nitrogen atoms according to the plasma nitriding process. As a result, the shared electrode 19 comprising the tantalum nitride is formed. It should be noted here that the tantalum nitride included in the shared electrode 19 does not need to be formed by replacing all oxygen atoms with nitrogen atoms. As is obvious from FIGS. 3 to 5, a small amount of oxygen may be included.

Next, as shown in (b) of FIG. 14, the interlayer insulating layer 31 is formed on the interlayer insulating layer 30 including the shared electrode 19. This interlayer insulating layer 31 is formed to have a thickness required to be filled with the semiconductor layer 34 and the upper electrode, 35 included in the non-ohmic element 20. As a material included in the interlayer insulating layer 31, TEOS-SiO or an interlayer insulating material that is commonly used in other semiconductor devices may be used. Moreover, as is the case with the interlayer insulating layer 30, the interlayer insulating layer 31 may have a two-layer structure where a harder insulating layer is formed on the top of the interlayer insulating layer 31.

Then, as shown in (c) of FIG. 14, a plurality of trenches 32 are formed so as to have the shared electrode 19 exposed and to extend in the second direction intersecting with (for example, orthogonal to) the first direction in which the lower electrode line 15 extends. This process is implemented by a common semiconductor process, such as dry etching.

After this, as shown in (a) of FIG. 15, the semiconductor film layer 341 that is to be the semiconductor layer 34 and the electrode film layer 351 that is to be the upper electrode 35 are formed on the interlayer insulating layer 31 including the trench 32. For these layers, the same materials as described in Embodiment 2 can be used.

Next, as shown in (b) of FIG. 15, the electrode film layer 351 and the semiconductor film layer 341 formed on the interlayer insulating layer 31 are eliminated according to the CMP process. As a result, the semiconductor layer 34 and the upper electrode 35 are filled in the trench 32.

As a result of the processes described thus far, as shown in (b) of FIG. 15, the variable resistance element 17 and the non-ohmic element 33 are formed. The variable resistance element 17 includes: the variable resistance layer 18; the first electrode 15a, i.e., the area, out of the region of the lower electrode line 15, that is connected to the variable resistance layer 18; and the shared electrode 19. The non-ohmic element 33 includes the shared electrode 19, the semiconductor layer 34, and the upper electrode 35. Furthermore, after this, an insulation protection layer (not illustrated) protecting the upper electrode 35 is formed. As a result, the non-volatile semiconductor memory device 10 according to the manufacturing method in Modification of Embodiment 2 can be manufactured.

When the non-volatile semiconductor memory device 10 is manufactured according to the manufacturing method as described above, the semiconductor layer 34 and the upper electrode 35 are filled in the interlayer insulating layer 31. On this account, for the case of further stacking the variable resistance element 17 and the non-ohmic element 33, this stacking process can be easily performed.

It should be noted that, in the non-volatile semiconductor memory device 10 in Modification, the semiconductor layer 34 having an approximately U-shaped cross-section is provided covering a lower surface and both side surfaces of the upper electrode 35, as shown in (b) of FIG. 15. Thus, depending on an insulating material selected for the interlayer insulating layer 31 and a metal material selected for the upper electrode 35, it may be useful when this semiconductor layer 34 can serve as a barrier film.

Embodiment 3

Figure 16:
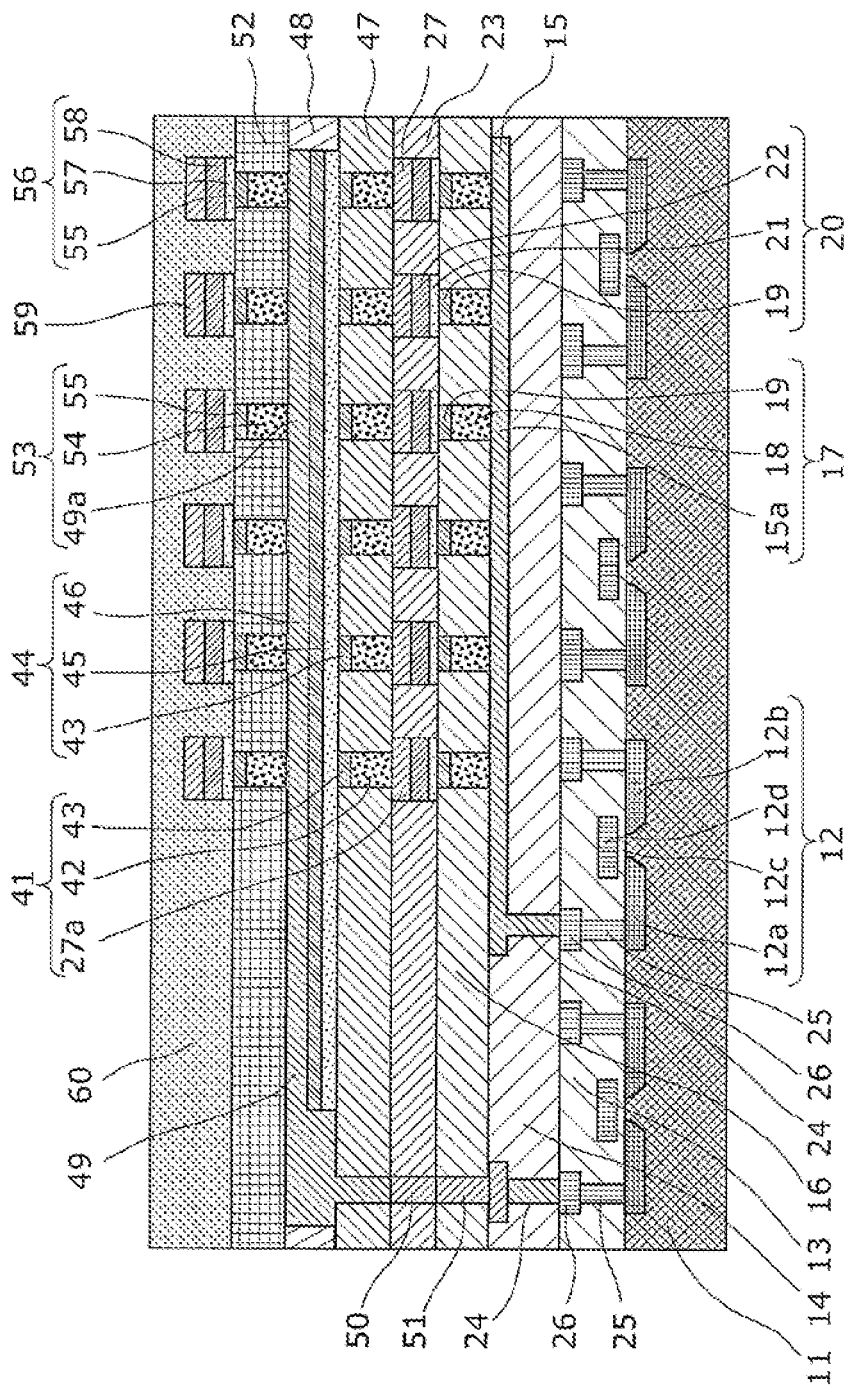
FIG. 16 is a cross-section diagram explaining a configuration of a non-volatile semiconductor memory device in Embodiment 3 according to the present invention.

The following is a description of Embodiment 3 according to the present invention, with reference to FIG. 16.

FIG. 16 is a cross-section diagram explaining a configuration of a non-volatile semiconductor memory device 40 in Embodiment 3 according to the present invention. This non-volatile semiconductor memory device 40 employs, as a basic configuration, the configuration of the non-volatile semiconductor memory device 10 shown in FIG. 6 in Embodiment 2. Here, note that one structural unit corresponds to one memory cell array. The memory cell array includes: an interlayer insulating layer; a variable resistance layer filled in a memory cell hole in the interlayer insulating layer; and a non-ohmic element. Then, the non-volatile semiconductor memory device 40 has the structure where two structural units are stacked on the basic configuration (that is, three-memory-array stacked structure). By stacking a plurality of memory cell arrays as the structural units in this way, a higher-capacity non-volatile semiconductor memory device can be implemented. Moreover, a structure having even more layers can be implemented by further stacking a plurality of the aforementioned structural units.

The following briefly describes the configuration of the non-volatile semiconductor memory device 40 in Embodiment 3. In the case of the non-volatile semiconductor memory device 10 shown in FIG. 6, the semiconductor layer 21 and the upper electrode 22 are connected to the upper layer line 27 outside the matrix region (where the memory cells, each of which includes the variable resistance element 17 and the non-ohmic element 20, are arranged in the array). On the other hand, in the non-volatile semiconductor memory device 40 in Embodiment 3, the upper layer line 27 is also provided extending onto the upper electrode 22 in the matrix region. The same is applied to second and third stacks included in the stacked structure of the memory cell arrays.

Moreover, the non-volatile semiconductor memory device 40 includes three stacks for each of the variable resistance element and the non-ohmic element. For the purpose of making it easy to distinguish among the components included in the first, second, and third stacks: the components included in the first stack are assigned "first"; the components included in the second stack are assigned "second"; and the components included in the third stack are assigned "third". To be more specific, in FIG. 16: the memory cell array including the variable resistance element 17 and the non-ohmic element 20 is referred to as the first stack; the memory cell array including a variable resistance element 41 and a non-ohmic element 44 is referred to as the second stack; and the memory cell array including a variable resistance element 53 and a non-ohmic element 56 is referred to as the third stack. The first stack is already described in detail in Embodiment 2 and, therefore, the explanation thereof is not repeated. In the first stack: the variable resistance layer 18 corresponds to a first variable resistance layer in Embodiment 3; the shared electrode 19 corresponds to a first shared electrode in Embodiment 3; the semiconductor layer 21 corresponds to a first semiconductor or insulator layer; and the upper electrode 22 corresponds to a first upper electrode in Embodiment 3.

The second stack is firstly explained. As shown in FIG. 16, in the second stack of the non-volatile semiconductor memory device 40, the variable resistance element 41 and the non-ohmic element 44 are provided in a second interlayer insulating layer 47 and a third interlayer insulating layer 48, respectively. The variable resistance element 41 includes a first upper layer line 27 (27a), a second variable resistance layer 42, and a second shared electrode 43. The non-ohmic element 44 includes the second shared electrode 43, a second semiconductor layer 45, and a second upper electrode 46. To be more specific, the second interlayer insulating layer 47 is formed on a first interlayer insulating layer (insulation protection layer) 23 including the first upper layer line 27 of the first stack. In the second interlayer insulating layer 47, memory cell holes are formed in an array, and the second variable resistance layer 42 and the second shared electrode 43 are formed in each of the memory cell holes. Each of the second semiconductor layer 45, the second upper electrode 46, and the second upper layer line 49 is plurally formed to be arranged in parallel so as to be connected to the second shared electrode 43 and so as to extend in a second direction intersecting with a first direction in which the first upper layer line 27 extends. Moreover, the third interlayer insulating layer 48 is formed to be filled with the second semiconductor layer 45, the second upper electrode 46, and the second upper layer line 49. Note that the second shared electrode 43 is formed by performing the plasma nitriding process on the upper surface of the second variable resistance layer 42.

Next, the third stack is explained. As shown in FIG. 16, in the third stack of the non-volatile semiconductor memory device 40, the variable resistance element 53 and the non-ohmic element 56 are provided in a fourth interlayer insulating layer 52 and an insulation protection layer 60, respectively. The variable resistance element 53 includes a second upper layer line 49 (49a), a third variable resistance layer 54, and a third shared electrode 55. The non-ohmic element 56 includes the third shared electrode 55, a third semiconductor layer 57, and a third upper electrode 58. To be more specific, the fourth interlayer insulating layer 52 is formed on the second upper layer line 49 and the third interlayer insulating layer 48. In the fourth interlayer insulating layer 52, memory cell holes are formed in an array, and the third variable resistance layer 54 and the third shared electrode 55 are formed in each of the memory cell holes. Each of the third semiconductor layer 57, the third upper electrode 58, and the third upper layer line 59 is plurally formed to be arranged in parallel so as to be connected to the third shared electrode 55 and so as to extend in a first direction intersecting with (for example, orthogonal to) a second direction in which the second upper layer line 49 extends. To be more specific, the third semiconductor layer 57, the third upper electrode 58, and the third upper layer line 59 are formed extending in the same direction as the first upper layer line 27. Moreover, the insulation protection layer 60 is formed to be filled with the third semiconductor layer 57, the third upper electrode 58, and the third upper layer line 59. Note that the third shared electrode 55 is formed by performing the plasma nitriding process on the upper surface of the third variable resistance layer 54.

It should be noted that the first interlayer insulating layer 23 and the second interlayer insulating layer 47 may be formed at one time, and that the third interlayer insulating layer 48 and the fourth interlayer insulating layer 52 may be formed at one time.

Moreover, the lower electrode line 15 is connected to the source region 12a of the active element 12 via the buried conductors 24 and 25 and the line 26. Similarly, the first upper layer line 27 is also connected to a different active element (not illustrated) via a different buried conductor (not illustrated) and a different line (not illustrated). Furthermore, as shown in FIG. 16, the second upper layer line 49 is connected to a source region 12a of another active element 12 via the buried conductors 24, 25, 50, and 51 and the line 26. Similarly, as is the case with the first upper layer line 27, the third upper layer line 59 is also connected to a different active element (not illustrated) via a different buried conductor (not illustrated) and a different line (not illustrated).

Each of the lower electrode line 15 and the upper layer line 27 in the first stack serves as either one of the bit line and the word line, and is connected to a corresponding output terminal of the bit line decoder 6 or the word line decoder 5 of the circuit shown in FIG. 8. Similarly, each of the first upper layer line 27 and the second upper layer line 49 serves as either one of the bit line and the word line of the second stack, and is connected to a corresponding output terminal of the bit line decoder 6 or the word line decoder 5 of the circuit shown in FIG. 8. It should be noted that, when the first upper layer line 27 serves as the bit line in the first stack, the first upper layer line 27 in the second stack is designed to serve as the bit line as well and the second upper layer line 49 is thus designed to serve as the word line. Moreover, when the second upper layer line 49 serves as the word line, the third upper layer line 59 in the third stack is designed to serve as the bit line. That is, the first upper layer line 27 and the third upper layer line 59 formed extending in the same direction (i.e., the first direction) are designed so as to serve as the lines (namely, the bit lines) having the same function.

In the non-volatile semiconductor memory device 40 in Embodiment 3 as described, the non-ohmic elements 20, 44, and 56 are provided for the variable resistance elements 17, 41, and 53, respectively in the aforementioned respective stacks. Therefore, reading and writing of the variable resistance elements 17, 41, and 53 provided in the respective stacks can be performed stably and reliably.

Accordingly, the non-volatile semiconductor memory device 40 having an even more stacks including the variable resistance element and the non-ohmic element can be manufactured basically by repeating one of the following process sequences described for manufacturing the non-volatile semiconductor memory device 10 in Embodiment 2: (1) the sequence of processes in FIGS. 6, 7, and 9 to 12 and (2) the sequence of processes in FIGS. 6, 7, 9, and 13 to 15.

Embodiment 4

Figure 17:
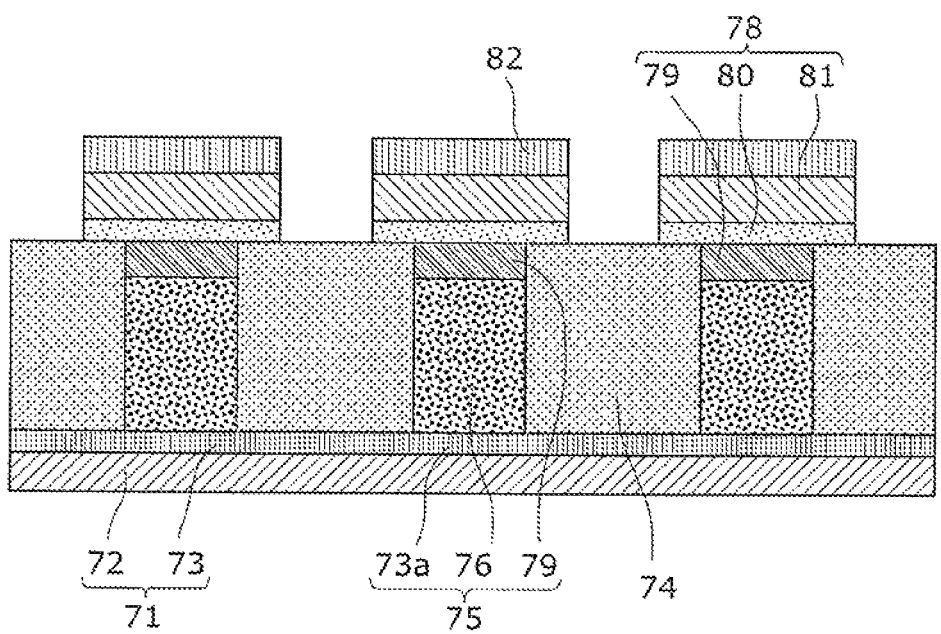
FIG. 17 is a cross-section diagram showing configurations of a variable resistance element and a non-ohmic element which are essential parts of a non-volatile semiconductor memory device in Embodiment 4 according to the present invention.

The following is a description of Embodiment 4 according to the present invention, with reference to FIG. 17.

FIG. 17 is a cross-section diagram showing configurations of a variable resistance element 75 and a non-ohmic element 78 which are essential parts of a non-volatile semiconductor memory device 70 in Embodiment 4 according to the present invention.

The non-volatile semiconductor memory device 70 in Embodiment 4 has the same basic configuration as the non-volatile semiconductor memory device 10 in Embodiment 2, and is different from the non-volatile semiconductor memory device 10 in that a lower electrode line 71 includes at least two layers.

As shown in FIG. 17, the lower electrode line 71 includes a lower line 72 and a connection electrode 73. The lower line 72 comprises a material that is most suitable for wiring. The connection electrode 73 connects the lower line 72 to a variable resistance layer 76, and comprises a material that is most suitable for an electrode. The connection electrode 73 positioned on a side where the variable resistance layer 76 is connected has a higher standard electrode potential than the variable resistance layer 76. Moreover, the electrode part of the connection electrode 73 comprising a conductive material that is difficult to oxidize or reduce. Furthermore, the variable resistance layer 76 is desired to have a function as a diffusion barrier by which it is hard for metal components included in the lower line 72 to diffuse. The lower line 72 positioned under the connection electrode 73 comprises a conductive material, such as aluminium (Al) or copper (Cu), that is commonly used as an electrode material in the semiconductor process.

Moreover, each of the semiconductor layer 80, the upper electrode 81, and the connection electrode 82 is plurally formed to be arranged in parallel, extending in a second direction intersecting with (for example, orthogonal to) a first direction in which the lower electrode line 71 extends. The connection electrode 82 is connected to an upper line (not illustrated), extending beyond the matrix region (where the memory cells, each of which includes the variable resistance element 75 and the non-ohmic element 78, are arranged in the array). However, the connection electrode 82 may serve as the upper line. The remaining configuration is the same as the non-volatile semiconductor memory device 10 in Embodiment 2.

To be more specific, the variable resistance element 75 includes: the variable resistance layer 76; a connection electrode 73a on which the variable resistance layer 76 is formed; and the shared electrode 79 formed by being filled. Here, the variable resistance layer 76 is positioned between the connection electrode 73a and the shared electrode 79. The non-ohmic element 78 is configured with an MSM diode including the shared electrode 79, the upper electrode 81, and the semiconductor layer 80. The shared electrode 79 is formed by being filled in the memory cell hole according to the plasma nitriding process performed on the upper surface of the variable resistance layer 76. The detailed description is omitted here.

It should be noted that, in Embodiment 4, the non-ohmic element 78 may be configured with an MSM diode including: the shared electrode 79 and the upper electrode 81 comprising TaN, TiN, or W; and the semiconductor layer 80 comprising a nitrogen-deficient silicon nitride ($SiN_z$ where $0<z\leq 0.85$). The $SiN_z$ film having such a semiconducting property can be formed in a nitrogen gas atmosphere using a Si target according to the reactive sputtering method. For example, the film may be manufactured at ambient temperature, with a chamber pressure being 0.1 Pa to 1 Pa and a flow rate of $Ar/N_2$ being 18/2 sccm.

When the $SiN_z$ film having the semiconducting property is manufactured under the aforementioned conditions and an additional condition that the thickness of the film is to be 16 nm, a current density of $2.5\times 10^3$ $A/cm^2$ is obtained by the application of a voltage of 1.6 V and a current density of $5\times 10^2$ $A/cm^2$ is obtained by the application of a voltage of 0.8 V. Thus, when these voltages are used as the standards, an On/Off ratio is 5. The non-ohmic element having such a configuration can be adequately used as the non-ohmic element included in the non-volatile semiconductor memory element.

Although the connection electrode 73 is provided on the lower electrode surface of the variable resistance layer 76 in Embodiment 4, this is not necessarily essential. For example, depending on the material selected for the variable resistance layer 76, the connection electrode 73 is unnecessary. In this case, the non-volatile semiconductor memory device may have the same configuration as the non-volatile semiconductor memory device 10 in Embodiment 1.

Embodiment 5

Figure 18:
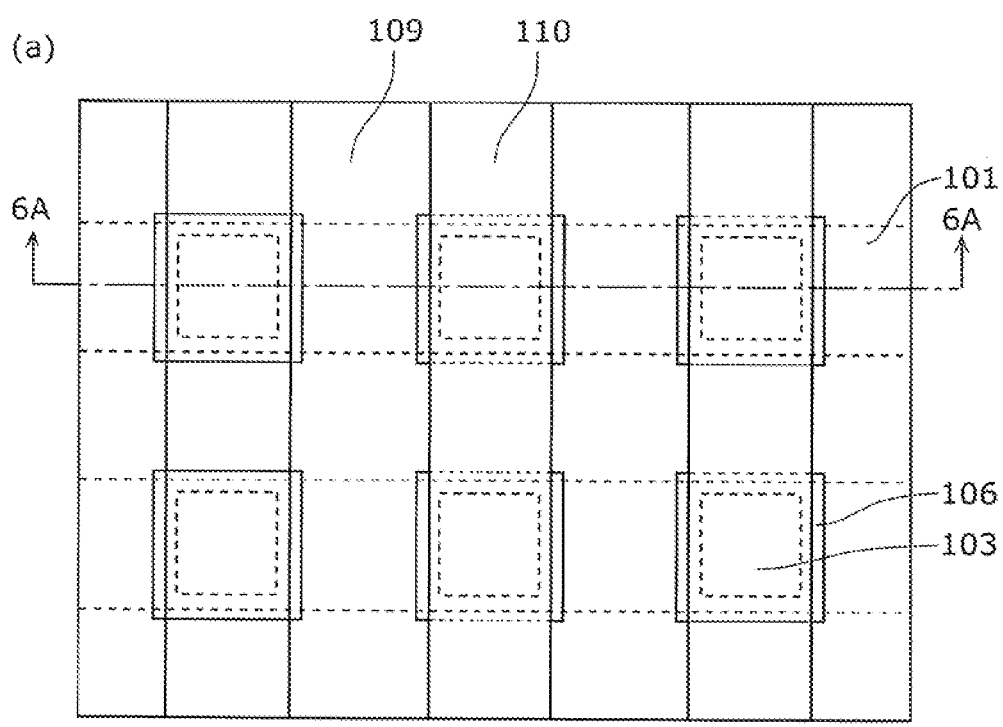
FIG. 18 is a diagram showing configurations of a variable resistance element and a non-ohmic element which are essential parts of a non-volatile semiconductor memory device in Embodiment according to the present invention, and (a) shows a top view whereas (b) shows a cross-section diagram viewed in the direction of arrows along a line 6A-6A shown in (a).
Figure 18:
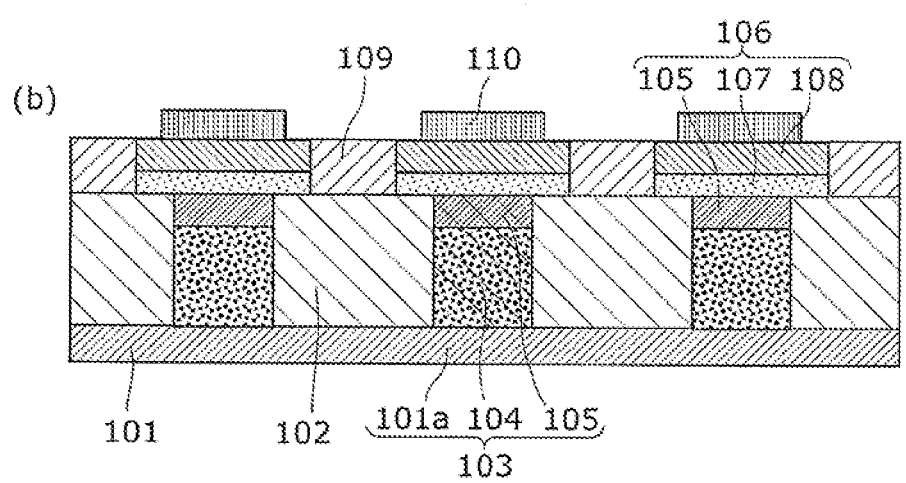

The following is a description of Embodiment 5 according to the present invention, with reference to FIG. 18.

FIG. 18 is a diagram showing configurations of a variable resistance element 103 and a non-ohmic element 106 which are essential parts of a non-volatile semiconductor memory device in Embodiment 5 according to the present invention. More specifically, in FIG. 18, (a) shows a top view and (b) shows a cross-section diagram viewed in the direction of arrows along a line 6A-6A shown in (a).

The non-volatile semiconductor memory device in Embodiment 5 has the same basic configuration as the non-volatile semiconductor memory device 10 in Embodiment 2, and is different from the non-volatile semiconductor memory device 10 in that a semiconductor layer 107 and an upper electrode 108 included in a non-ohmic element 106 are formed separately for each of variable resistance elements 103.

To be more specific, in the non-volatile semiconductor memory device shown in (b) of FIG. 18, a variable resistance layer 104 and a shared electrode 105 are formed in a memory cell hole formed in an interlayer insulating layer 102 on a lower electrode line 101, and the semiconductor layer 107 and the upper electrode 108 are formed on the shared electrode 105. As a result, the non-ohmic element 106 including the shared electrode 105, the semiconductor layer 107, and the upper electrode 108 is formed.

Then, an upper line 110 is formed on the interlayer insulating layer 109 in which the non-ohmic element 106 is filled and on the upper electrode 108. A plurality of upper lines 110 are formed in parallel, extending in a second direction intersecting with (for example, orthogonal to) a first direction in which the lower electrode line 101 extends. The upper line 110 is formed by patterning, after a conductive material layer is formed on the interlayer insulating layer 109 and the upper electrode 108. Here, the conductive material layer comprises, for example, aluminium (Al) or copper (Cu) commonly used as an electrode material in the semiconductor process.

With this configuration, the semiconductor layer 107 and the upper electrode 108 of the non-ohmic element 106 can be provided independently for each of the non-ohmic elements 106. Thus, an optimum material can be selected for each of the semiconductor layer 107 and the upper electrode 108 of the non-ohmic element 106. Moreover, the upper layer line 110 is formed directly on the upper electrode 18. This can simplify the process of connecting the upper layer line 110 to an active element (not illustrated) via a buried conductor (not illustrated, but corresponding to the buried conductor 28 shown in (b) of FIG. 6 for example) in a contact hole provided outside the matrix region (where the memory cells, each of which includes the variable resistance element 103 and the non-ohmic element 106, are arranged in the array). To be more specific, the process of eliminating the semiconductor layer of the non-ohmic element in the contact region can be omitted. Thus, the dual damascene method can be used, thereby simplifying the process.

As in the case of the non-volatile semiconductor memory device in Embodiment 3, each of the non-volatile semiconductor memory devices in Embodiments 4 and 5 may have the stacked structure including a plurality of memory cell arrays.

Moreover, in Embodiment 5, one non-volatile semiconductor memory element includes one non-ohmic element and one variable resistance element. However, the present invention is not limited to this. For example, a plurality of non-ohmic elements may be separated at one time, instead of one at a time.

Embodiments have been described thus far. In each of Embodiments described above, the variable resistance layer is all filled inside the memory cell hole. However, by forming the first variable resistance layer 212a on a front layer part of the lower electrode line, the first variable resistance layer 212a may be positioned outside the memory cell hole.

Each of Embodiments describes the case, as an example, where a tantalum oxide is used for the variable resistance layer. However, a hafnium oxide may be used instead of the tantalum oxide. By performing the plasma nitriding process on the hafnium oxide, a hafnium nitride is formed. Here, the hafnium nitride has conductivity (for example, 225 μΩcm of substrate-temperature resistivity). On account of this, the hafnium nitride can be easily used for the variable resistance layer according to the present invention in which the plasma nitriding process is performed on the hafnium oxide to form the shared electrode.

Moreover, it is preferable for the first electrode 201 coming contact with the first variable resistance layer 212a to comprise one or more of materials having higher standard electrode potentials than tantalum or hafnium used as the transition metal included in the variable resistance layer. Such materials include Au (gold), Pt (platinum), Ir (iridium), Pd (palladium), Ag (silver), and Rh (rhodium). With this configuration, a resistance change operation can be stably caused in the variable resistance layer.

Furthermore, each of Embodiments above describes the case where the MSM diode is used as an example of the non-ohmic element. However, an MIM diode or a varistor may be used instead of the MSM diode. To be more specific, even when the semiconductor layer of the MSM diode is replaced by an insulator layer or a semiconductor ceramic layer, the same advantageous effects as in Embodiments above can be obtained.

It is to, be noted that, from the above description, various changes and modifications are apparent to those skilled in the art. Therefore, the embodiments disclosed thus far only describe examples in all respects and are intended only to show, to those skilled in the art, examples of aspects according to the present invention. Unless such changes and modifications obtained made by those skilled in the art through the application of various modifications to the exemplary embodiments or through a combination of the features of the exemplary embodiments depart from the scope of the present invention, they should be construed as being included therein.

INDUSTRIAL APPLICABILITY

The method of manufacturing a non-volatile semiconductor memory device according to the present invention simplifies a process of manufacturing an element by forming a shared electrode by performing the plasma nitriding process on an upper surface of the variable resistance layer, the shared electrode serving as both an upper electrode of a variable resistance element and a lower electrode of a non-ohmic element. Moreover, the method according to the present invention can reduce variations in characteristics of the non-ohmic elements, stabilize the resistance to pressure of the non-ohmic elements, and implement miniaturization of the non-volatile memory element. Thus, the present method is useful in various electronics fields requiring memory devices that are compact in size and stable in characteristics.

REFERENCE SIGNS LIST

5 Word line decoder
6 Bit line decoder
7 Read circuit
10, 40, 70, 1000 Non-volatile semiconductor memory device
11 Substrate
12 Active element
12a Source region
12b Drain region
12c Gate insulating film
12d Gate electrode
13, 14, 16, 30, 31, 47, 48, 52, 102, 109 Interlayer insulating layer
15, 71, 101 Lower electrode line
15a, 201 First electrode
17, 41, 53, 75, 103, 206, 1260 Variable resistance element
18, 42, 54, 76, 104, 202, 212, 1230 Variable resistance layer
19, 43, 55, 79, 105, 203 Shared electrode
20, 33, 44, 56, 78, 106, 207 Non-ohmic element
21, 34, 45, 57, 80, 107, 204 Semiconductor layer (semiconductor layer or insulating layer)
22, 35, 46, 58, 81, 108, 1240 Upper electrode (second electrode)
23, 60 Insulation protection layer (interlayer insulating layer)
24, 25, 28, 50, 51 Buried conductor
26 Line
27, 27a, 49, 49a, 59, 110 Upper layer line
29 Memory cell hole
30a First insulating layer
30b Second insulating layer
32 Trench
72 Lower line
73, 73a, 82 Connection electrode
181 Resistance film layer
205 Second electrode
341 Semiconductor film layer (semiconductor film layer or insulator film layer)
351 Electrode film layer

The invention claimed is:

1. A method of manufacturing a non-volatile semiconductor memory element including a variable resistance element and a non-ohmic element connected in series with the variable resistance element,
the variable resistance element including (i) a first electrode, (ii) a variable resistance layer formed on the first electrode, and (iii) a shared electrode formed in an upper part of the variable resistance layer,
the non-ohmic element including (i) the shared electrode, (ii) one of a semiconductor layer and an insulator layer formed on the shared electrode, and (iii) a second electrode formed on the one of the semiconductor layer and the insulator layer, and
the method comprising:
forming the first electrode on a substrate;
forming the variable resistance layer on the first electrode, the variable resistance layer comprising an oxide of a transition metal;
forming the shared electrode having a front surface comprising a nitride of the transition metal, by replacing oxygen atoms in a front surface part of the variable resistance layer with nitrogen atoms by nitriding a front surface of the variable resistance layer;
forming the one of the semiconductor layer and the insulator layer on the shared electrode; and
forming the second electrode on the one of the semiconductor layer and the insulator layer,
wherein the front surface of the shared electrode comprises the nitride of the transition metal including the transition metal and nitrogen, so that a Schottky barrier is formed in an interfacial surface between the shared electrode and the semiconductor or insulator layer.

2. The method of manufacturing the non-volatile semiconductor memory element according to claim 1,
wherein the oxide of the transition metal is one of a tantalum oxide and a hafnium oxide, and
a front surface of the one of the tantalum oxide and the hafnium oxide is nitrided so as to form the shared electrode having a front surface comprising a corresponding one of a tantalum nitride and a hafnium nitride.

3. The method of manufacturing the non-volatile semiconductor memory element according to claim 1,
wherein the variable resistance layer includes:
a first transition metal oxide layer formed on the first electrode; and
a second transition metal oxide layer that is formed on the first transition metal oxide layer and has a lower oxygen content atomic percentage than the first transition metal oxide layer.

4. A method of manufacturing a cross point non-volatile semiconductor memory device including a plurality of non-volatile semiconductor memory elements arranged in an array, each of the non-volatile semiconductor memory elements having a variable resistance element and a non-ohmic element connected in series with the variable resistance element,
the variable resistance element including (i) a lower electrode line formed to be shared by, among the non-volatile semiconductor memory elements arranged in the array, non-volatile semiconductor memory elements arranged in a first direction, (ii) a variable resistance layer formed on the lower electrode line, and (iii) a shared electrode formed in an upper part of the variable resistance layer,
the non-ohmic element including (i) the shared electrode, (ii) one of a semiconductor layer and an insulator layer formed on the shared electrode, and (iii) an upper electrode formed on the one of the semiconductor layer and the insulator layer, and
the method comprising:
forming, on a substrate, a plurality of lower electrode lines in parallel in the first direction;
forming an interlayer insulating layer on the substrate including the lower electrode lines;
forming a plurality of memory cell holes in the interlayer insulating layer formed on the lower electrode lines;
filling an oxide of a transition metal included in the variable resistance layer into the memory cell holes;
forming the shared electrode having a front surface comprising a nitride of the transition metal, by replacing oxygen atoms in a front surface part of the variable resistance layer with nitrogen atoms by nitriding a front surface of the variable resistance layer; and
forming, on the shared electrode and the interlayer insulating layer, the semiconductor or insulator layer and the upper electrode to be shared by, among the non-volatile semiconductor memory elements arranged in the array, non-volatile semiconductor memory elements arranged in a second direction different from the first direction, each of widths of the formed semiconductor or insulator layer and the formed upper electrode being greater than a width of the shared electrode, and each of the semiconductor or insulator layer and the upper electrode being plurally formed in parallel corresponding to the non-volatile semiconductor memory elements arranged in the second direction,
wherein, in the forming of the shared electrode, a front surface of the oxide of the transition metal is nitrided so as to form the shared electrode having a front surface comprising the nitride of the transition metal, and
the front surface of the shared electrode comprises the nitride of the transition metal including the transition metal and nitrogen, so that a Schottky barrier is formed in an interfacial surface between the shared electrode and the semiconductor or insulator layer.

5. The method of manufacturing the non-volatile semiconductor memory device according to claim 4,
wherein the oxide of the transition metal is one of a tantalum oxide and a hafnium oxide, and
a front surface of the one of the tantalum oxide and the hafnium oxide is nitrided so as to form the shared electrode having a front surface comprising a corresponding one of a tantalum nitride and a hafnium nitride.

6. The method of manufacturing the non-volatile semiconductor memory device according to claim 4,
wherein the variable resistance layer includes:
a first transition metal oxide layer formed on the first electrode; and
a second transition metal oxide layer that is formed on the first transition metal oxide layer and has a lower oxygen content atomic percentage than the first transition metal oxide layer.

7. A method of manufacturing a cross point non-volatile semiconductor memory device including a plurality of non-volatile semiconductor memory elements arranged in an array, each of the non-volatile semiconductor memory elements having a variable resistance element and a non-ohmic element connected in series with the variable resistance element,
the variable resistance element including (i) a lower electrode line formed to be shared by, among the non-volatile semiconductor memory elements arranged in the array, non-volatile semiconductor memory elements arranged in a first direction, (ii) a variable resistance layer formed on the lower electrode line, and (iii) a shared electrode formed in an upper part of the variable resistance layer,
the non-ohmic element including (i) the shared electrode, (ii) one of a semiconductor layer and an insulator layer formed on the shared electrode, and (iii) an upper electrode formed on the one of the semiconductor layer and the insulator layer, and
the method comprising:
(a) forming, on a substrate, a plurality of lower electrode lines in parallel in the first direction;
(b) forming a first interlayer insulating layer on the substrate including the lower electrode lines;
(c) forming a plurality of first memory cell holes in the first interlayer insulating layer formed on the lower electrode lines;
(d) filling an oxide of a transition metal included in the first variable resistance layer into the first memory cell holes;
(e) forming a plurality of first shared electrodes by nitriding front surfaces of the plurality of first variable resistance layers;
(f) forming, on the first shared electrode and the first interlayer insulating layer, the first semiconductor or insulator layer and the first upper electrode to be shared by, among the non-volatile semiconductor memory elements arranged in the array, non-volatile semiconductor memory elements arranged in a second direction different from the first direction, each of widths of the formed first semiconductor or insulator layer and the formed first upper electrode being greater than a width of the first shared electrode, and each of the first semiconductor or insulator layer and the first upper electrode being plurally formed in parallel corresponding to the non-volatile semiconductor memory elements arranged in the second direction;

(g) forming an insulation protection layer on an area, out of a region of the first interlayer insulating layer, where the first semiconductor or insulator layer and the first upper electrode are not formed;

(h) forming a second interlayer insulating layer on the insulation protection layer;

(i) forming a plurality of second memory cell holes in the second interlayer insulating layer formed on the first upper electrode;

(j) filling an oxide of a transition metal included in the second variable resistance layer into the second memory cell holes;

(k) forming a plurality of second shared electrodes by nitriding front surfaces of the second variable resistance layers; and (l) forming, on the second shared electrode and the second interlayer insulating layer, the second semiconductor or insulator layer and the second upper electrode to be shared by, among the non-volatile semiconductor memory elements arranged in the array, the non-volatile semiconductor memory elements arranged in the first direction, each of widths of the formed second semiconductor or insulator layer and the formed second upper electrode being greater than a width of the second shared electrode, and each of the second semiconductor or insulator layer and the second upper electrode being plurally formed in parallel corresponding to the non-volatile semiconductor memory elements arranged in the first direction, wherein, in each of the forming of the plurality of first shared electrodes by nitriding the front surfaces of the plurality of first variable resistance layers and the forming of the plurality of second shared electrodes by nitriding the front surfaces of the second variable resistance layers, the front surfaces of the second variable resistance layers are nitrided to replace oxygen atoms in front surface parts of the first and second variable resistance layers with nitrogen atoms so that the front surfaces of the first and second variable resistance layers form the shared electrodes comprising the nitride of the transition metal, the front surface of the shared electrode comprises the nitride of the transition metal including the transition metal and nitrogen, so that a Schottky barrier is formed in an interfacial surface between the shared electrode and the semiconductor or insulator layer, and processes (a) to (l) correspond to a basic unit of processing, and a plurality of stacked structures are formed by repeating (b) to (l) after performing (l), each of the stacked structures including the variable resistance element and the non-ohmic element stacked on the variable resistance element.

8. The method of manufacturing the non-volatile semiconductor memory device according to claim 7,
wherein the oxide of the transition metal is one of a tantalum oxide and a hafnium oxide, and
a front surface of the one of the tantalum oxide and the hafnium oxide is nitrided so as to form the shared electrode having a front surface comprising a corresponding one of a tantalum nitride and a hafnium nitride.

9. The method of manufacturing the non-volatile semiconductor memory device according to claim 7,
wherein the variable resistance layer includes:
a first transition metal oxide layer formed on the first electrode; and
a second transition metal oxide layer that is formed on the first transition metal oxide layer and has a lower oxygen content atomic percentage than the first transition metal oxide layer.

10. The method of manufacturing the non-volatile semiconductor memory element according to claim 1,
wherein, in the forming of the shared electrode, the front surface of the oxide of the transition metal is nitrided according to the plasma nitriding process so as to form the shared electrode comprising the nitride of the transition metal.

11. The method of manufacturing the non-volatile semiconductor memory element according to claim 1,
wherein the plasma nitriding process for forming the shared electrode is performed under an application of heat of 400 degrees centigrade or higher.

12. The method of manufacturing the non-volatile semiconductor memory element according to claim 1,
wherein the plasma nitriding process for forming the shared electrode is performed for 180 seconds or longer.

13. The method of manufacturing the non-volatile semiconductor memory device according to claim 4,
wherein, in the forming of the shared electrode, the front surface of the oxide of the transition metal is nitrided according to the plasma nitriding process so as to form the shared electrode comprising the nitride of the transition metal.

14. The method of manufacturing the non-volatile semiconductor memory device according to claim 4,
wherein the plasma nitriding process for forming the shared electrode is performed under an application of heat of 400 degrees centigrade or higher.

15. The method of manufacturing the non-volatile semiconductor memory device according to claim 4,
wherein the plasma nitriding process for forming the shared electrode is performed for 180 seconds or longer.

16. The method of manufacturing the non-volatile semiconductor memory device according to claim 7,
wherein, in the forming of the shared electrode, the front surface of the oxide of the transition metal is nitrided according to the plasma nitriding process so as to form the shared electrode comprising the nitride of the transition metal.

17. The method of manufacturing the non-volatile semiconductor memory device according to claim 7,
wherein the plasma nitriding process for forming the shared electrode is performed under an application of heat of 400 degrees centigrade or higher.

18. The method of manufacturing the non-volatile semiconductor memory device according to claim 7,
wherein the plasma nitriding process for forming the shared electrode is performed for 180 seconds or longer.

* * * * *